(12) United States Patent
Hu

(10) Patent No.: US 10,461,090 B2
(45) Date of Patent: Oct. 29, 2019

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventor: Ming Hu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 160 days.

(21) Appl. No.: 15/263,827

(22) Filed: Sep. 13, 2016

(65) Prior Publication Data

US 2018/0026045 A1   Jan. 25, 2018

Related U.S. Application Data

(60) Provisional application No. 62/365,431, filed on Jul. 22, 2016.

(51) Int. Cl.
| | |
|---|---|
| H01L 27/11565 | (2017.01) |
| H01L 27/1157 | (2017.01) |
| H01L 27/11582 | (2017.01) |
| H01L 27/11575 | (2017.01) |

(52) U.S. Cl.
CPC .... *H01L 27/11565* (2013.01); *H01L 27/1157* (2013.01); *H01L 27/11575* (2013.01); *H01L 27/11582* (2013.01)

(58) Field of Classification Search
CPC ........... H01L 27/1157; H01L 27/11582; H01L 29/7827
See application file for complete search history.

(56) References Cited

U.S. PATENT DOCUMENTS

| | | | |
|---|---|---|---|
| 8,766,351 B2 | 7/2014 | Imamura et al. | |
| 8,878,278 B2 | 11/2014 | Alsmeier et al. | |
| 8,884,357 B2 | 11/2014 | Wang et al. | |
| 2011/0233648 A1* | 9/2011 | Seol ................. | H01L 21/32137 257/324 |
| 2016/0293627 A1* | 10/2016 | Kim .................. | H01L 27/11565 |

FOREIGN PATENT DOCUMENTS

JP    2006-41398    2/2006

* cited by examiner

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

A semiconductor memory device according to an embodiment comprises a substrate, a plurality of first conductive films, a memory columnar body, and a first structure. The plurality of first conductive films are stacked in a first direction above the substrate and extend in a second direction intersecting the first direction and in a third direction intersecting the first direction and the second direction. The memory columnar body extends in the first direction and has a side surface covered by the plurality of first conductive films. The first structure extends in the second direction and divides the plurality of first conductive films in the third direction. Moreover, each of the memory columnar body and the first structure comprises: a memory insulating film provided on a side surface of the first conductive film; and a first semiconductor layer provided on a side surface of the memory insulating film.

12 Claims, 43 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/365,431, filed on Jul. 22, 2016, the entire contents of which are incorporated herein by reference.

FIELD

Embodiments described herein relate to a semiconductor memory device and a method of manufacturing the same.

BACKGROUND

Description of the Related Art

In recent years, a semiconductor memory device in which memory cells are disposed three-dimensionally (three-dimensional type semiconductor memory device) has been proposed. Such a semiconductor memory device comprises, for example: a plurality of first conductive films arranged in a first direction above a substrate; and a memory columnar body extending in the above-described first direction and having its side surface covered by the above-described plurality of first conductive films. Moreover, the memory columnar body comprises: a memory insulating film provided on a side surface of the first conductive film; and a first semiconductor layer provided on a side surface of the memory insulating film.

DETAILED DESCRIPTION

Figure 1:
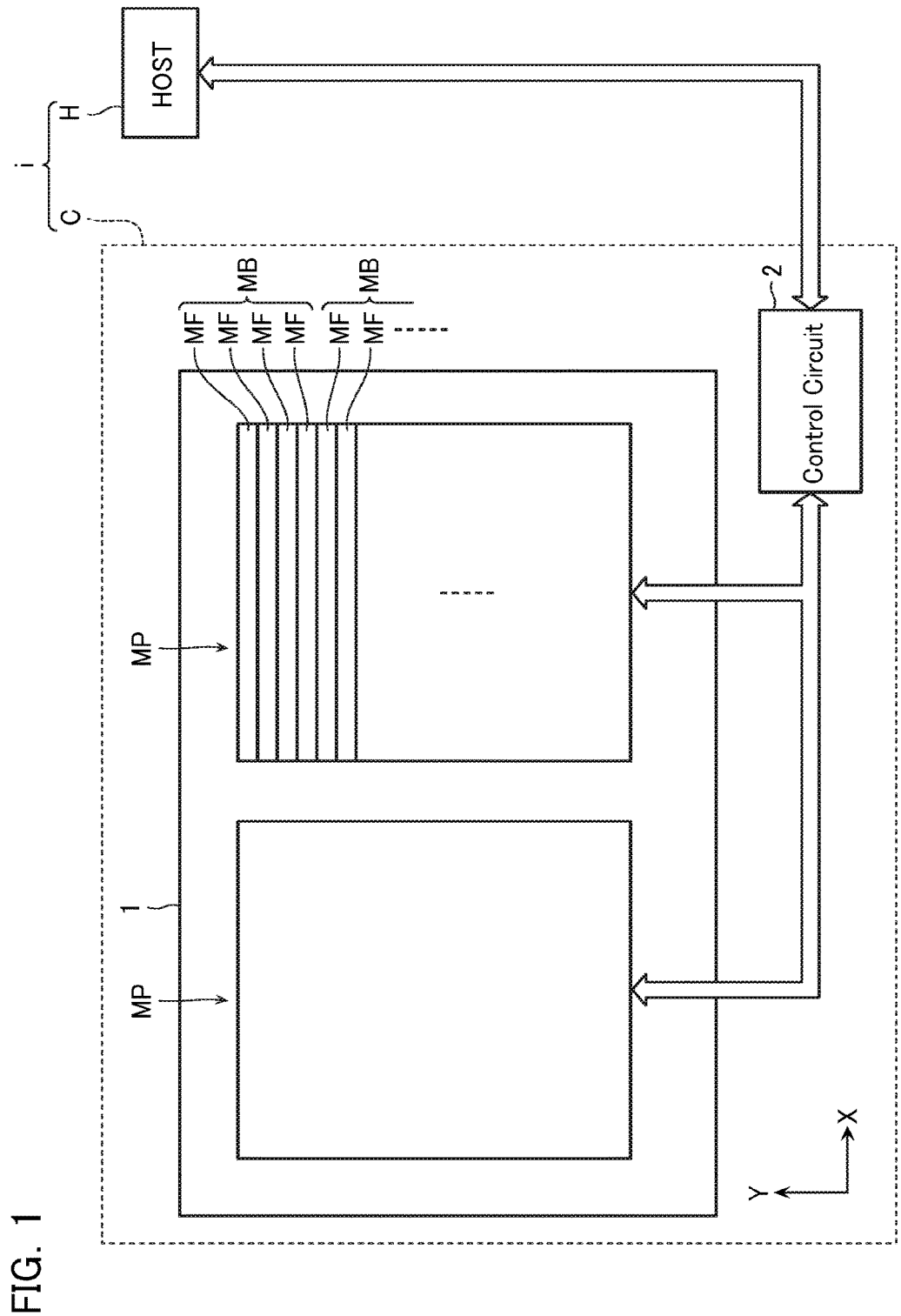
FIG. 1 is a block diagram showing a configuration of a semiconductor memory device according to a first embodiment.

A semiconductor memory device according to an embodiment comprises a substrate, a plurality of first conductive films, a memory columnar body, and a first structure. The plurality of first conductive films are stacked in a first direction above the substrate and extend in a second direction intersecting the first direction and in a third direction intersecting the first direction and the second direction. The memory columnar body extends in the first direction and has a side surface covered by the plurality of first conductive films. The first structure extends in the second direction and divides the plurality of first conductive films in the third direction. Moreover, each of the memory columnar body and the first structure comprise: a memory insulating film provided on a side surface of the first conductive film; and a first semiconductor layer provided on a side surface of the memory insulating film.

Next, semiconductor memory devices and methods of manufacturing the same according to embodiments will be described in detail with reference to the drawings. Note that these embodiments are merely examples, and are not shown with the intention of limiting the present invention.

For example, each of the drawings of the semiconductor memory devices and methods of manufacturing the same employed in the embodiments below is schematic, and sometimes, thicknesses, widths, and ratios of films, numbers of components or portions in certain configurations, and so on, do not match those of the actual semiconductor memory devices and methods of manufacturing the same.

Moreover, the semiconductor memory devices described below comprise: a plurality of first conductive films arranged in a first direction above a substrate; and a memory columnar body extending in the first direction and having a side surface covered by the above-described plurality of first conductive films. Moreover, the memory columnar body comprises: a memory insulating film provided on a side surface of the first conductive film; and a first semiconductor layer provided on a side surface of the memory insulating film.

The above-described first conductive film may be formed of a metal such as tungsten (W), or may be formed of the likes of polysilicon.

The above-described memory columnar body is, for example, connected at its one end (for example, lower end) to the likes of a second semiconductor layer or a metal film. The second semiconductor layer may be the upper surface of the substrate, or may be a semiconductor layer provided above the substrate. In addition, for example, the one ends (lower ends) of two or more of the memory columnar bodies may be connected via the second semiconductor layer or the metal film, and so on. Additionally, the second semiconductor layer or the metal film may extend in both of the second direction and the third direction or only one of these directions.

The above-described insulating film comprises, for example, a charge accumulation film capable of accumulating a charge. Such a charge accumulation film may be an insulating film capable of accumulating a charge, of the likes of silicon nitride, for example, or may be a floating gate configured of the likes of a semiconductor. Note that as an example including a floating gate as a charge accumulation film, reference is made to U.S. patent application Ser. No. 13/112,345 whose disclosure content is herewith incorporated by this reference.

Moreover, in the example described below, a direction intersecting the upper surface (surface where a circuit is formed) of the substrate will be called a first direction, a direction intersecting the first direction will be called a second direction, and a direction intersecting the first direction and the second direction will be called a third direction.

In addition, a certain direction parallel to the upper surface of the substrate will be called an X direction, a direction parallel to the upper surface of the substrate and perpendicular to the X direction will be called a Y direction, and a direction perpendicular to the upper surface of the substrate will be called a Z direction. Note that the description below exemplifies the case where the first direction corresponds with the Z direction, the second direction corresponds with the X direction, and the third direction corresponds with the Y direction, but the first through third directions need not correspond with the Z direction, the X direction, and the Y direction.

Moreover, in the description below, a direction moving away from the substrate along the first direction will be called an upward direction, and a direction moving towards the substrate along the first direction will be called a downward direction. Moreover, a direction following the second direction or the third direction will be called a lateral direction. Moreover, when a lower surface is referred to for a configuration other than the substrate, this is assumed to mean a surface facing the substrate of this configuration, and when an upper surface is referred to for a configuration other than the substrate, this is assumed to mean a surface on an opposite side to the substrate of this configuration. Moreover, a surface intersecting the second direction or the third direction will be called a side surface. Moreover, when a lower end is referred to for a certain configuration, this is assumed to mean an end closest to the substrate of this configuration, and when an upper end is referred to for a certain configuration, this is assumed to mean an end furthest from the substrate of this configuration.

Moreover, in the description below, when one configuration is said to "divide" another configuration, this is assumed to indicate, for example, the following kind of state. For example, when the above-described other configuration extends in the second direction and the third direction and the above-described one configuration extends in the above-described second direction, it indicates a state that the above-described one configuration is provided over an entire width in the second direction of the above-described other configuration and that with this one configuration as a boundary, the other configuration is at least divided in two in the third direction. Note that a direction in which the one configuration extends and a direction in which the other configuration is divided need only intersect, and need not be orthogonal. Moreover, when, for example, a plurality (for example, two) of the above-described one configurations are arranged in the third direction, the above-described other configuration is divided into three or more (for example, three) configurations. In this case, intervals at which the above-described one configurations are arranged may be equal intervals, but need not be equal intervals.

[Semiconductor Memory Device According to First Embodiment]

FIG. 1 is a block diagram of a semiconductor memory device according to a first embodiment. Note that the semiconductor memory device referred to herein means, for example, the likes of a chip C storing user data or an electronic device i (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device i comprises: the chip C; and a host H that controls this chip C. The chip C comprises: a memory die 1 provided with a memory plane MP; and a control circuit 2 that controls the memory plane MP.

The memory die 1 comprises, for example, two memory planes MP aligned in the X direction. The memory plane MP comprises a plurality of memory blocks MB arranged in the Y direction. The memory block MB comprises a plurality of (for example, four) memory fingers MF arranged in the Y direction.

The control circuit 2 comprises a decode circuit, a sense amplifier circuit, a voltage generating circuit, a state machine, a data input/output buffer, and so on. Part of the control circuit 2 is provided on the memory die 1, for example. The control circuit 2 performs operations such as read, write, and erase of user data (hereafter, these will be called "read, and so on"), based on a control signal from the host H.

Figure 2:
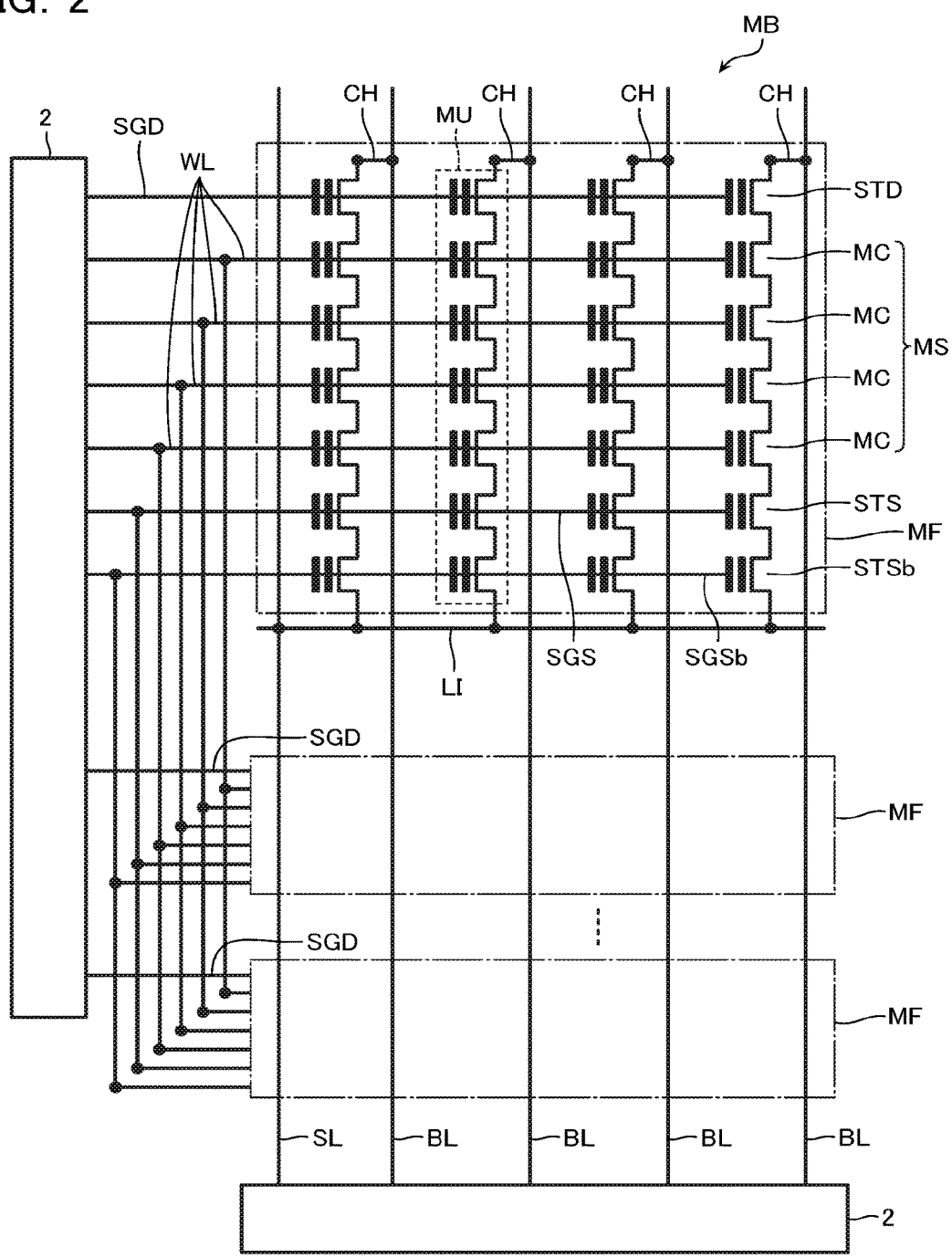
FIG. 2 is a circuit diagram showing a configuration of the same semiconductor memory device.

FIG. 2 is an equivalent circuit diagram showing a configuration of the memory block MB. The memory block MB is connected to the control circuit 2 via bit line BL, a source line SL, word lines WL, and select gate lines (drain side select gate lines SGD, source side select gate lines SGS, and lowermost layer source side select gate lines SGSb). Note that for convenience of explanation, part of the configuration is omitted in FIG. 2.

The plurality of memory fingers MF in the memory block MB each comprise a plurality of memory units MU. One ends of these plurality of memory units MU are respectively connected to the bit lines BL via bit line contacts CH. Moreover, the other ends of these plurality of memory units MU are each connected to the source line SL via a common source line contact LI.

The memory unit MU comprises a drain side select gate transistor STD, a memory string MS, a source side select gate transistor STS, and a lowermost layer source side select gate transistor STSb that are connected in series between the bit line contact CH and the source line contact LI. Hereafter, the drain side select gate transistor STD, the source side select gate transistor STS, and the lowermost layer source side select gate transistor STSb will sometimes simply be called select gate transistors (STD, STS, STSb).

The memory string MS comprises a plurality of memory cells MC connected in series. The memory cell MC is a field effect transistor that comprises: a first semiconductor layer functioning as a channel body; a gate insulating film (memory insulating film) capable of accumulating a charge; and a control gate electrode, and stores a one-bit portion or a multiple-bit portion of data configuring user data. A threshold voltage of the memory cell MC changes according to a charge amount in the memory insulating film. Note that the word lines WL are respectively connected to the control gate electrodes of the plurality of memory cells MC belonging to one memory string MS. These word lines WL are each commonly connected to all of the memory strings MS in one memory finger MF. Moreover, the plurality of word lines WL in one memory block MB are commonly connected between the plurality of memory fingers MF in one memory block MB.

The select gate transistors (STD, STS, STSb) are field effect transistors that comprise: a semiconductor layer functioning as a channel body; and a control gate electrode. Select gate lines (SGD, SGS, SGSb) are respectively connected to the control gate electrodes of the select gate transistors (STD, STS, STSb). The select gate lines (SGD, SGS, SGSb) are each commonly connected to all of the select gate transistors (STD, STS, STSb) in one memory finger MF. Moreover, the plurality of drain side select gate lines SGD in one memory block MB are independently connected to the control circuit 2 every memory finger MF. On the other hand, the pluralities of source side select gate lines SGS and lowermost layer source side select gate lines SGSb in one memory block MB are commonly connected between the plurality of memory fingers MF in one memory block MB.

Figure 3:
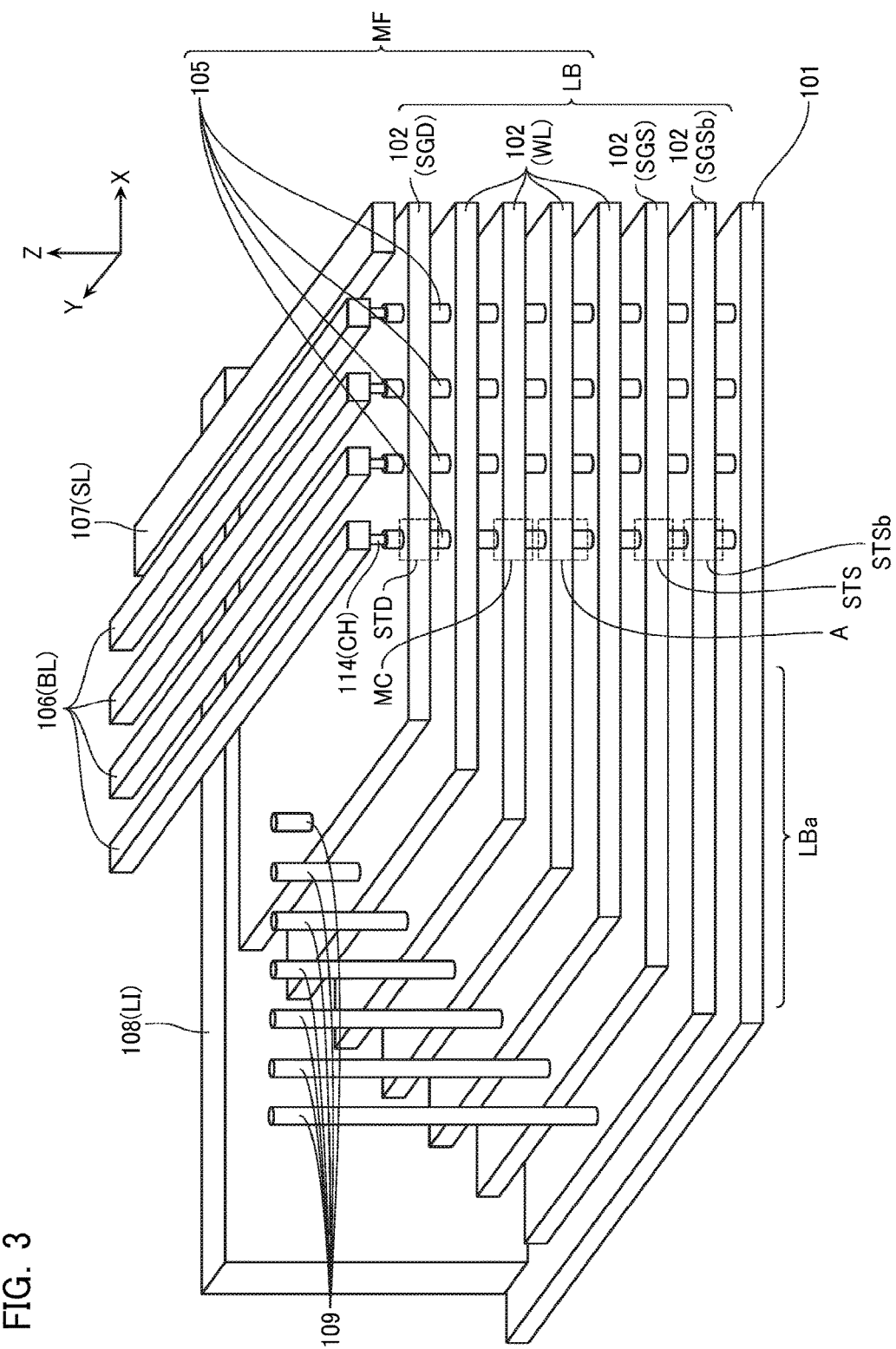
FIG. 3 is a schematic perspective view showing a configuration of the same semiconductor memory device.

FIG. 3 is a schematic perspective view showing a configuration of the memory finger MF. Note that FIG. 3 explains a three-dimensional structure of the likes of a wiring line or the memory cell MC, and does not show an inter-layer insulating film provided between the wiring lines, and so on.

The memory finger MF includes: a stacked body LB provided above a substrate 101 (second semiconductor layer); and a memory columnar body 105 whose side surface is covered by the stacked body LB. Moreover, the memory finger MF is connected to the control circuit 2 (FIGS. 1 and 2) via a second conductive film 108 (LI), a conductive film 107 (SL), a conductive film 114 (CH), a conductive film 106 (BL), and a conductive film 109.

The substrate 101 (second semiconductor layer) is a semiconductor substrate configured of the likes of monocrystalline silicon (Si), for example. The substrate 101 comprises, for example, a double well structure that includes an N type impurity layer and a P type impurity layer close to an upper surface of the substrate 101. The substrate 101 extends in the X direction and the Y direction, and is connected to lower ends of the memory columnar body 105 and the second conductive film 108. The upper surface of the substrate 101 functions as a channel body of a field effect transistor that electrically connects or disconnects the memory columnar body 105 and the second conductive film 108 (LI).

The stacked body LB includes a plurality of first conductive films 102 arranged in the Z direction. These first conductive films 102 extend in the X direction and the Y direction over the entire memory plane MP (FIG. 1), for example. The first conductive film 102 is configured of the likes of a stacked film of tungsten (W) and titanium nitride ($TiN_x$) (hereafter, this will be called "tungsten (W), and so on"), for example. The first conductive films 102 respectively function as the word line WL and control gate electrode of the memory cell MC, or as the select gate lines (SGD, SGS, SGSb) and control gate electrodes of the select gate transistors (STD, STS, STSb). Moreover, the stacked body LB includes at its end in the X direction a stepped part LBa formed in a stepped shape, and is connected at this stepped part LBa to the conductive film 109.

The memory columnar body 105 has a substantially circular column shape extending in the Z direction. An intersection of the memory columnar body 105 and the first conductive film 102 functions as the memory cell MC or the select gate transistors (STD, STS, STSb).

The second conductive film 108 (LI) is configured from, for example, tungsten (W), and so on, and has a substantially plate-like shape extending in the X direction and the Z direction. The second conductive film 108 is connected, at its lower end, to the substrate 101, and functions as the source line contact LI.

The conductive film 107 (SL), the conductive film 114 (CH), the conductive film 106 (BL), and the conductive film 109 are configured of, for example, tungsten (W), and so on. The conductive film 107 is provided above the stacked body LB, the memory columnar body 105, and the second conductive film 108, and extends in the Y direction. The conductive film 107 is connected to the second conductive film 108 (LI), and functions as the source line SL. The conductive film 114 has a circular column shape extending in the Z direction, is connected, at its lower end, to the memory columnar body 105, and functions as the bit line contact CH. The conductive film 106 is provided above the stacked body LB, the memory columnar body 105, and the second conductive film 108, extends in the Y direction, and is arranged in plurality in the X direction. The conductive film 106 is connected to the memory columnar body 105 via the conductive film 114, and functions as the bit line BL. The conductive film 109 has a circular column shape extending in the Z direction, and is connected, at its lower end, to an upper surface of the first conductive film 102. The conductive film 109 is arranged in plurality in the X direction, and functions as a contact connected to the first conductive film 102.

Figure 4:
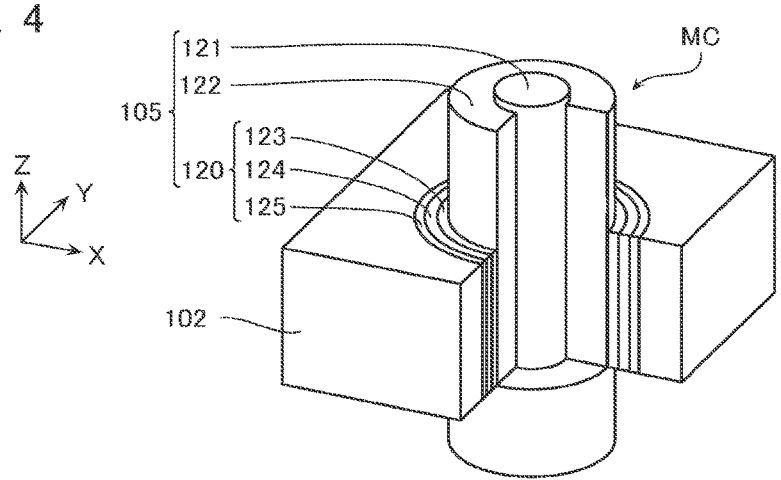
FIG. 4 is a schematic perspective view showing a configuration of the same semiconductor memory device.

FIG. 4 is an enlarged view of a portion indicated by symbol A in FIG. 3. The memory columnar body 105 comprises: a memory insulating film 120 provided on a side surface of the first conductive film 102; a first semiconductor layer 122 provided on a side surface of the memory insulating film 120; and a core insulating film (third insulating film) 121 whose side surface is covered by the first semiconductor layer 122.

The memory insulating film 120 is a gate insulating film capable of accumulating a charge, and has a substantially cylindrical shape extending in the Z direction. The memory insulating film 120 comprises a block insulating film (first insulating film) 125, a charge accumulation film 124, and a tunnel insulating film (second insulating film) 123 that are provided sequentially on the side surface of the first conductive film 102. The block insulating film 125 is configured of an insulating film of the likes of silicon oxide ($SiO_2$) or alumina ($Al_2O_3$), for example. The charge accumulation film 124 is configured of an insulating film capable of accumulating a charge, of the likes of silicon nitride ($Si_3N_4$), for example. The tunnel insulating film 123 is configured of an oxide such as silicon oxide ($SiO_2$), for example.

The first semiconductor layer 122 is configured of the likes of polysilicon, for example, and has a substantially cylindrical shape extending in the Z direction. The first semiconductor layer 122 functions as channel bodies of the memory cell MC and the select gate transistors (STS, STD).

The core insulating film (third insulating film) 121 has a substantially circular column shape extending in the Z direction. The core insulating film 121 is configured of an insulating film of the likes of silicon oxide ($SiO_2$), for example.

Next, the semiconductor memory device according to the present embodiment will be described in more detail.

Figure 5:
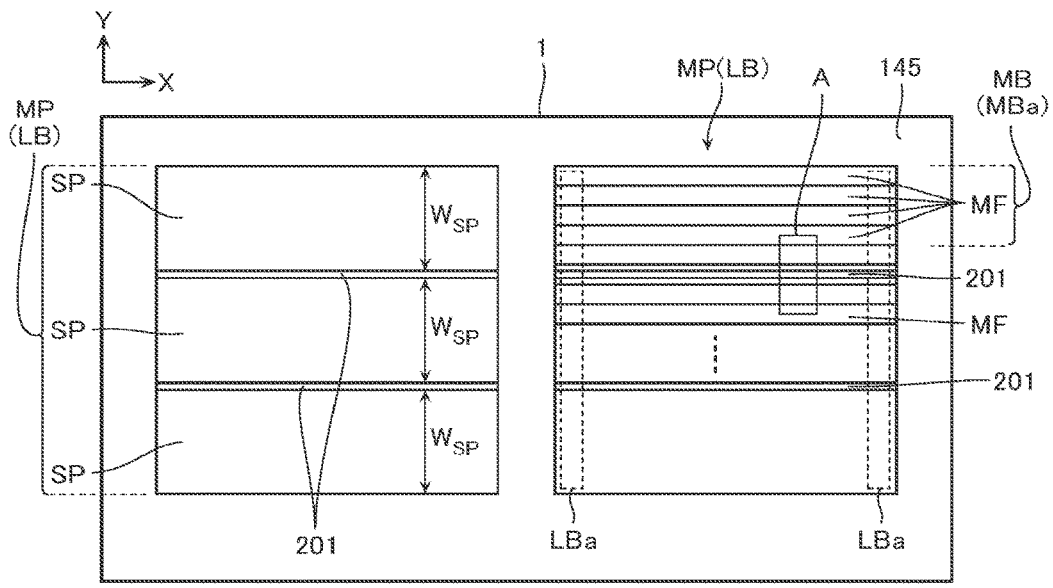
FIG. 5 is a plan view showing a configuration of the same semiconductor memory device.

FIG. 5 is a schematic XY plan view of the memory die 1 according to the present embodiment. Note that FIG. 5 shows the likes of the stepped part LBa (refer to FIG. 3) and a first structure 201 that were omitted in FIG. 1. Note that in the example of FIG. 5, the stepped part LBa is provided at both ends in the X direction of the stacked body LB, but the stepped part LBa may be provided only at one end.

The memory plane MP (stacked body LB) according to the present embodiment is divided into a plurality of portions in the Y direction. Hereafter, each of the portions of the memory plane MP divided in the Y direction will be called a sub-plane SP. Moreover, a plurality of configurations dividing the memory plane MP (stacked body LB) into the sub-planes SP will each be called the first structure 201. The first structure 201 extends in the X direction so as to divide the stacked body LB including the stepped part LBa, and is arranged in plurality in the Y direction. The first structures 201 may be arranged at first intervals $W_{SP}$ in the Y direction, but need not be arranged at equal intervals.

Hereafter, the memory block MB in the sub-plane SP will sometimes be called a first memory block MBa. In the example shown, one sub-plane SP includes one first memory block MBa, but the sub-plane SP may include a plurality of the first memory blocks MBa, and includes at least a plurality of the memory fingers MF.

Figure 6:
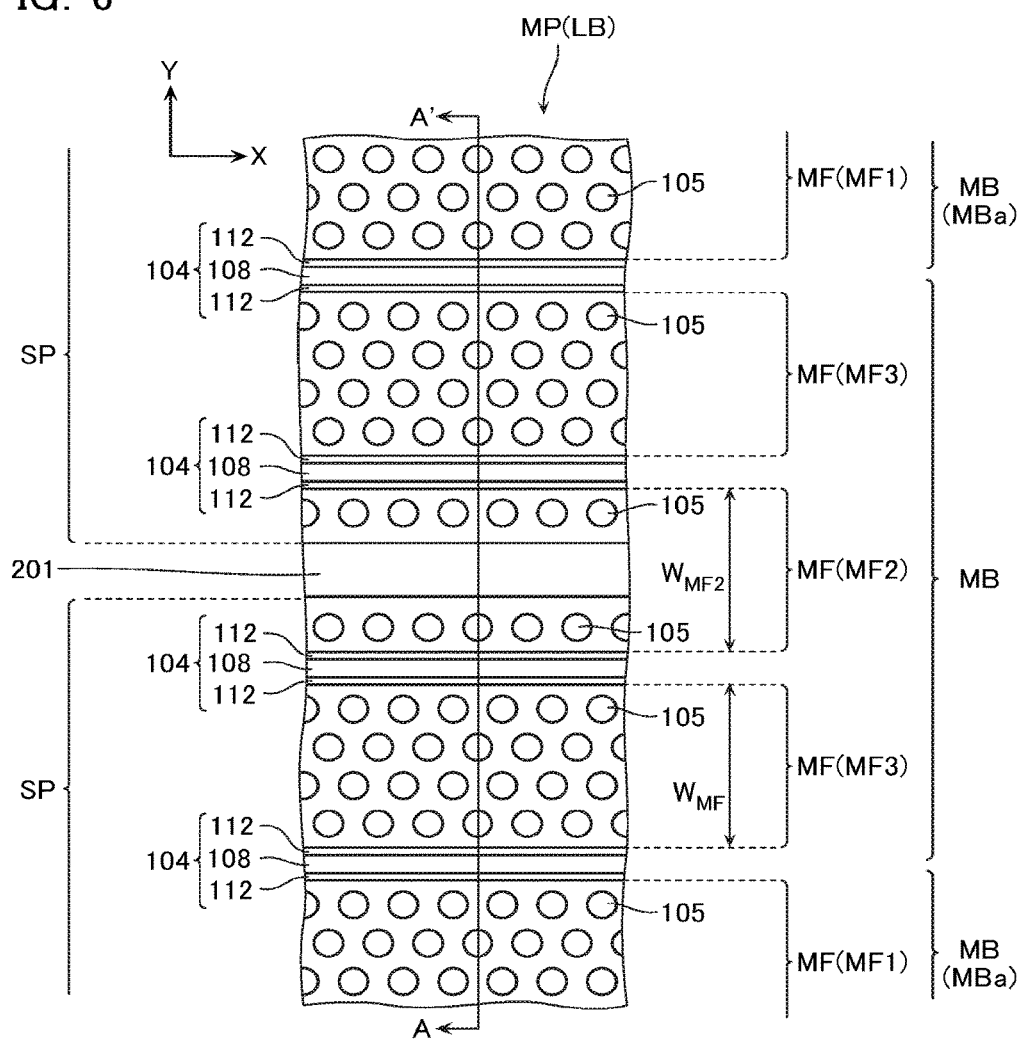
FIG. 6 is an enlarged view of part of FIG. 5.

FIG. 6 is an enlarged view of a portion indicated by symbol A in FIG. 5. Note that FIG. 6 is for explaining about the memory finger MF, and so on, and does not show the likes of the bit line BL.

The memory plane MP (stacked body LB) is divided in the Y direction into a plurality of the memory fingers MF. Hereafter, a memory finger MF in the first memory block MBa will be called a first memory finger MF1. Moreover, a memory finger MF provided at a boundary of two sub-planes SP adjacent in the Y direction will be called a second memory finger MF2, and a memory finger MF provided between the first memory finger MF1 and the second memory finger MF2 will be called a third memory finger MF3. In addition, a plurality of configurations dividing the memory plane MP (stacked body LB) into the memory fingers MF in the sub-plane SP will be called a second structure 104.

The first memory finger MF1 and the third memory finger MF3 are provided within the sub-plane SP. Moreover, the first memory finger MF1 and the third memory finger MF3 are provided with a plurality of the memory columnar bodies 105 arranged staggered. The second memory finger MF2 is provided with a plurality of the memory columnar bodies 105 in a manner that the first structure 201 is avoided. Note that the first memory finger MF1 records user data, but the second memory finger MF2 and the third memory finger MF3 may be configured as dummy fingers not recording user data. Moreover, the second memory finger MF2 need not be provided with the memory columnar body 105. Furthermore, in the example shown, a width $W_{MF}$ in the Y direction of the first memory finger MF1 and the third memory finger MF3 is equal to a width $W_{MF2}$ in the Y direction of the second memory finger MF2, but the width $W_{MF2}$ may be made smaller than the width $W_{MF}$. Moreover, the third memory finger MF3 may be omitted, or there may be two or more of the third memory fingers MF3 provided between the first memory finger MF1 and the second memory finger MF2.

The second structures 104 extend in the X direction and are arranged at second intervals (=width $W_{MF}$) in the Y direction. Note that the second interval $W_{MF}$ is smaller than the first interval $W_{SP}$ (FIG. 5). The second structure 104 comprises the second conductive film 108 (LI) and a fourth insulating film 112. The fourth insulating film 112 is configured of the likes of silicon oxide ($SiO_2$), for example, and is provided between the second conductive film 108 and the stacked body LB to electrically insulate the second conductive film 108 and the stacked body LB.

Figure 7:
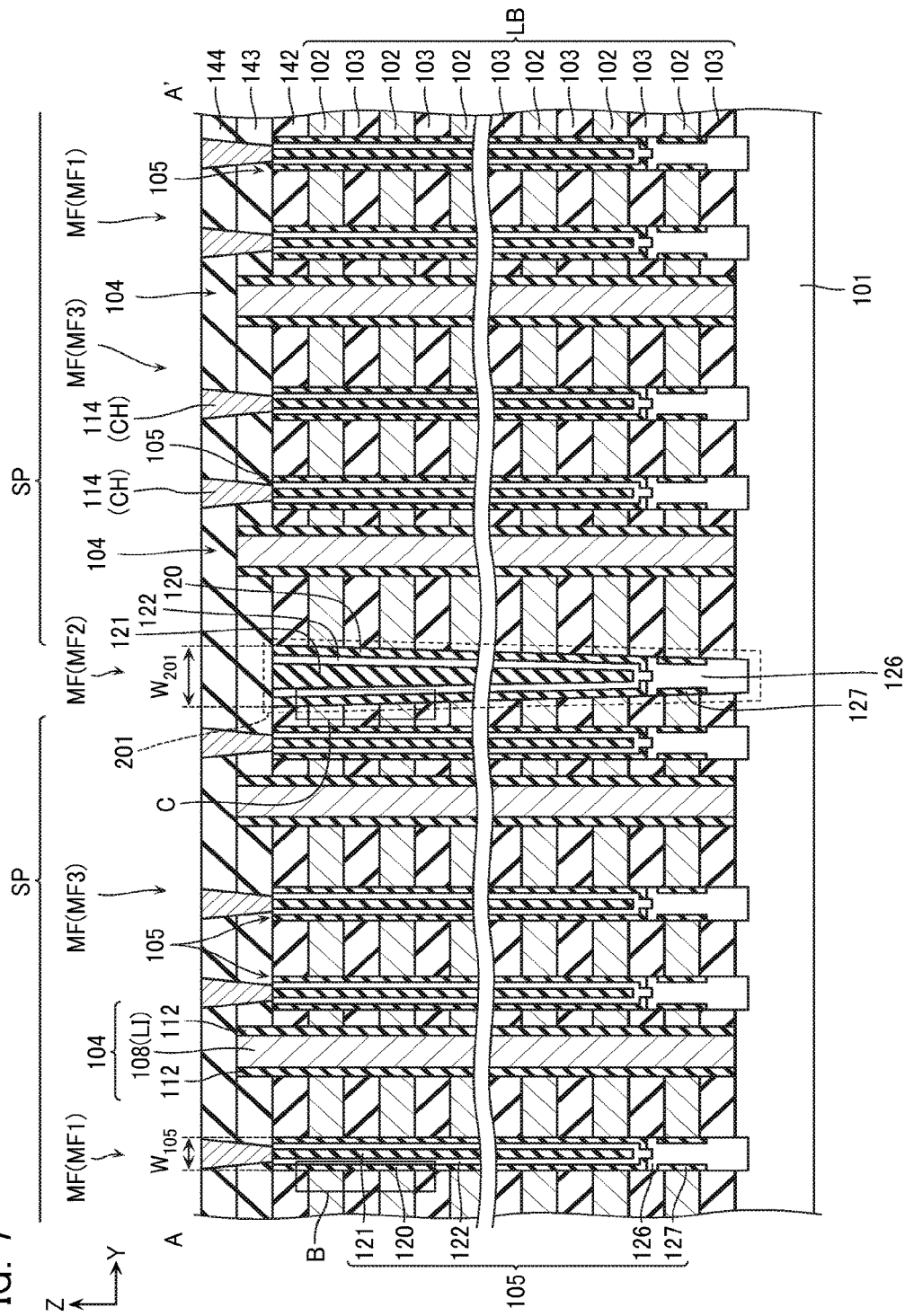
FIG. 7 is a cross-sectional view showing a configuration of the same semiconductor memory device.
Figure 8:
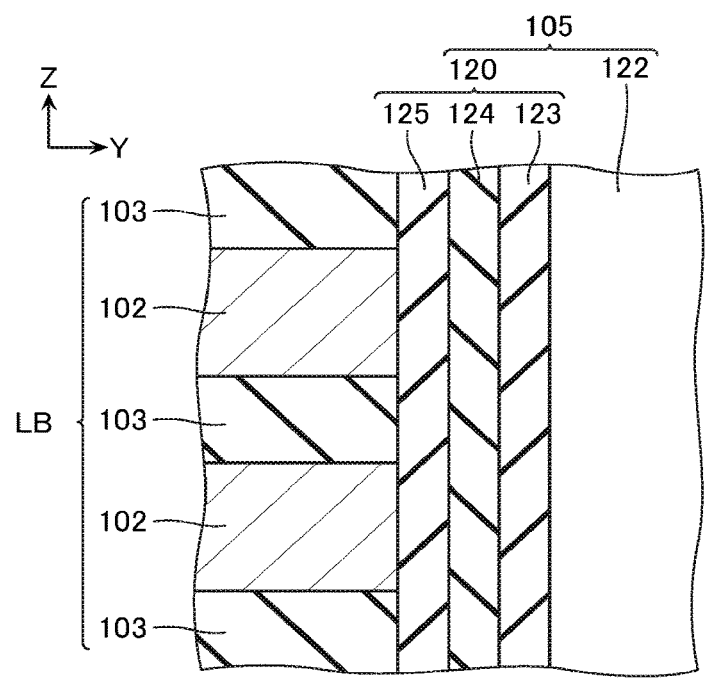
FIGS. 8 and 9 are enlarged views of parts of FIG. 7.
Figure 9:
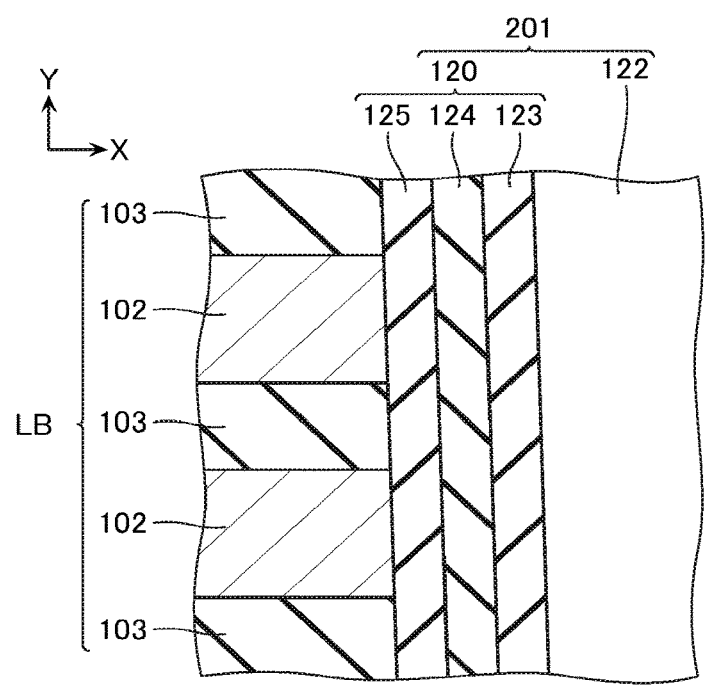

FIG. 7 is a YZ cross-sectional view of a structure shown in FIG. 6 cut along the line AA' looking in the direction of the arrows. FIG. 8 is an enlarged view of a portion indicated by symbol B in FIG. 7. FIG. 9 is an enlarged view of a portion indicated by symbol C in FIG. 7. Note that FIG. 7 shows insulating films 142, 143, and 144, and the conductive film 114 (CH) that were omitted in FIG. 6.

As shown in FIG. 7, the stacked body LB, in addition to including the plurality of first conductive films 102, includes also inter-layer insulating films 103 provided between these first conductive films 102. The inter-layer insulating film 103 is configured of the likes of silicon oxide ($SiO_2$), for example, and extends in the X direction and the Y direction.

The memory columnar body 105, in addition to including the memory insulating film 120, the first semiconductor layer 122, and the core insulating film 121, includes also: a third semiconductor layer 126 provided at a lower end of the first semiconductor layer 122; and an insulating film 127 provided on a side surface of the third semiconductor layer 126. The third semiconductor layer 126 extends in the Z direction and, at its lower end, contacts the substrate 101. In addition, the third semiconductor layer 126 is configured of the likes of monocrystalline silicon whose orientation has been aligned with that of the substrate 101, for example, and functions as a channel body of the lowermost layer source side select gate transistor STSb. The insulating film 127 is provided between the first conductive film 102 and the third semiconductor layer 126. The insulating film 127 is configured of the likes of silicon oxide ($SiO_2$), for example, and functions as a gate insulating film of the lowermost layer source side select gate transistor STSb. Moreover, as shown in FIG. 8, in the present embodiment, the block insulating film 125, the charge accumulation film 124, the tunnel insulating film 123, and the first semiconductor layer 122 extend in the Z direction and are stacked sequentially on side surfaces of the plurality of first conductive films 102 and inter-layer insulating films 103.

As shown in FIG. 7, the first structure 201 comprises similar configurations to those of the memory columnar body 105. That is, the first structure 201 comprises: the memory insulating film 120 provided on a side surface of the first conductive film 102; the first semiconductor layer 122 provided on a side surface of the memory insulating film 120; and the core insulating film 121 whose side surface is covered by the first semiconductor layer 122. In addition, the first semiconductor layer 122 extends in the Z direction, the third semiconductor layer 126 is provided at a lower end of the first semiconductor layer 122, and the insulating film 127 is provided on a side surface of the third semiconductor layer 126. Furthermore, as shown in FIG. 9, the memory insulating film 120 comprises the first insulating film 125, the charge accumulation film 124, and the second insulating film 123 that are provided sequentially on side surfaces of the plurality of first conductive films 102 and inter-layer insulating films 103.

On the other hand, the first structure 201 shown in FIG. 7 differs from the memory columnar body 105 in the following points. That is, a width $W_{201}$ in the Y direction of the first structure 201 is larger than a width $W_{105}$ in the Y direction of the memory columnar body 105. These width $W_{201}$ and width $W_{105}$ are, for example, widths of upper ends of the first structure 201 and the memory columnar body 105. Moreover, the core insulating film 121 in the first structure 201 has an inversely tapered shape extending in the Z direction. Moreover, configurations in the first structure 201, contrary to those in the memory columnar body 105, are not formed in a cylindrical shape or circular column shape, and all have a plate-like shape extending in the X direction.

The insulating film 142 is provided on an upper surface of the stacked body LB. Moreover, the insulating film 143 is provided on upper surfaces of the insulating film 142, the memory columnar body 105, and the first structure 201. Furthermore, the insulating film 144 is provided on upper surfaces of the insulating film 143 and the second structure 104. The conductive film 114 (CH) penetrates the insulating film 143 and the insulating film 144 to contact an upper surface of the first semiconductor layer 122. The insulating films 142, 143, and 144 are configured of the likes of silicon oxide ($SiO_2$), for example.

As described above, the memory plane (stacked body LB) according to the present embodiment is divided into a plurality of sub-planes SP by the first structure 201. Moreover, the first structure 201 comprises similar configurations to those of the memory columnar body 105. Although a detailed description will be made later, such a structure can be easily manufactured since deformation is suppressed in a manufacturing step.

Note that when, for example, the second memory finger MF2 or the third memory finger MF3 is configured as a dummy finger, the dummy finger may have the conductive film 114 omitted. Moreover, even when conductive films 114 are provided to the dummy fingers, these conductive films 114 need not be connected to the bit line BL, and so on.

[Method of Manufacturing According to First Embodiment]

Figure 10:
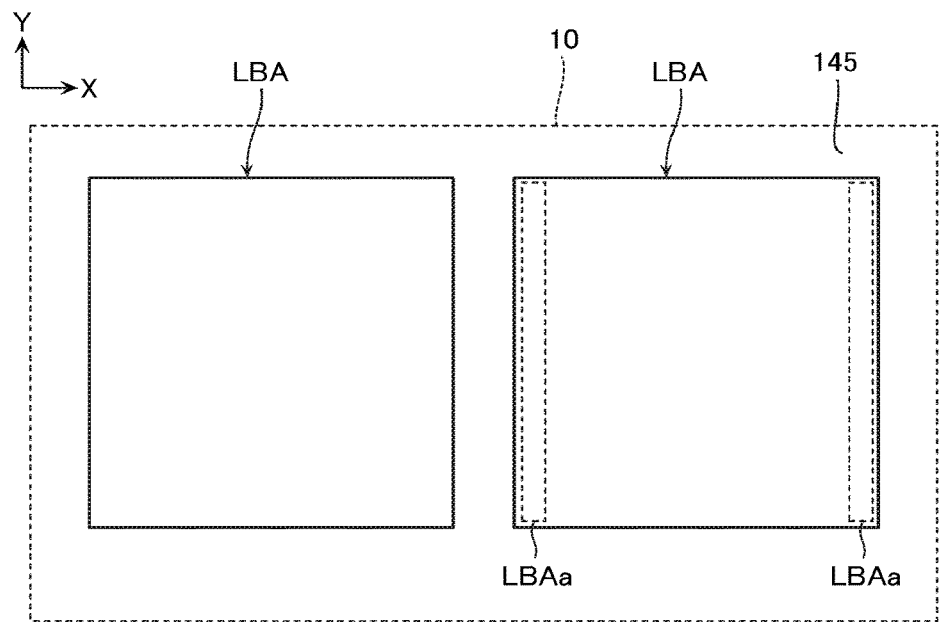
FIGS. 10 to 27 are views showing a method of manufacturing the same semiconductor memory device.
Figure 11:
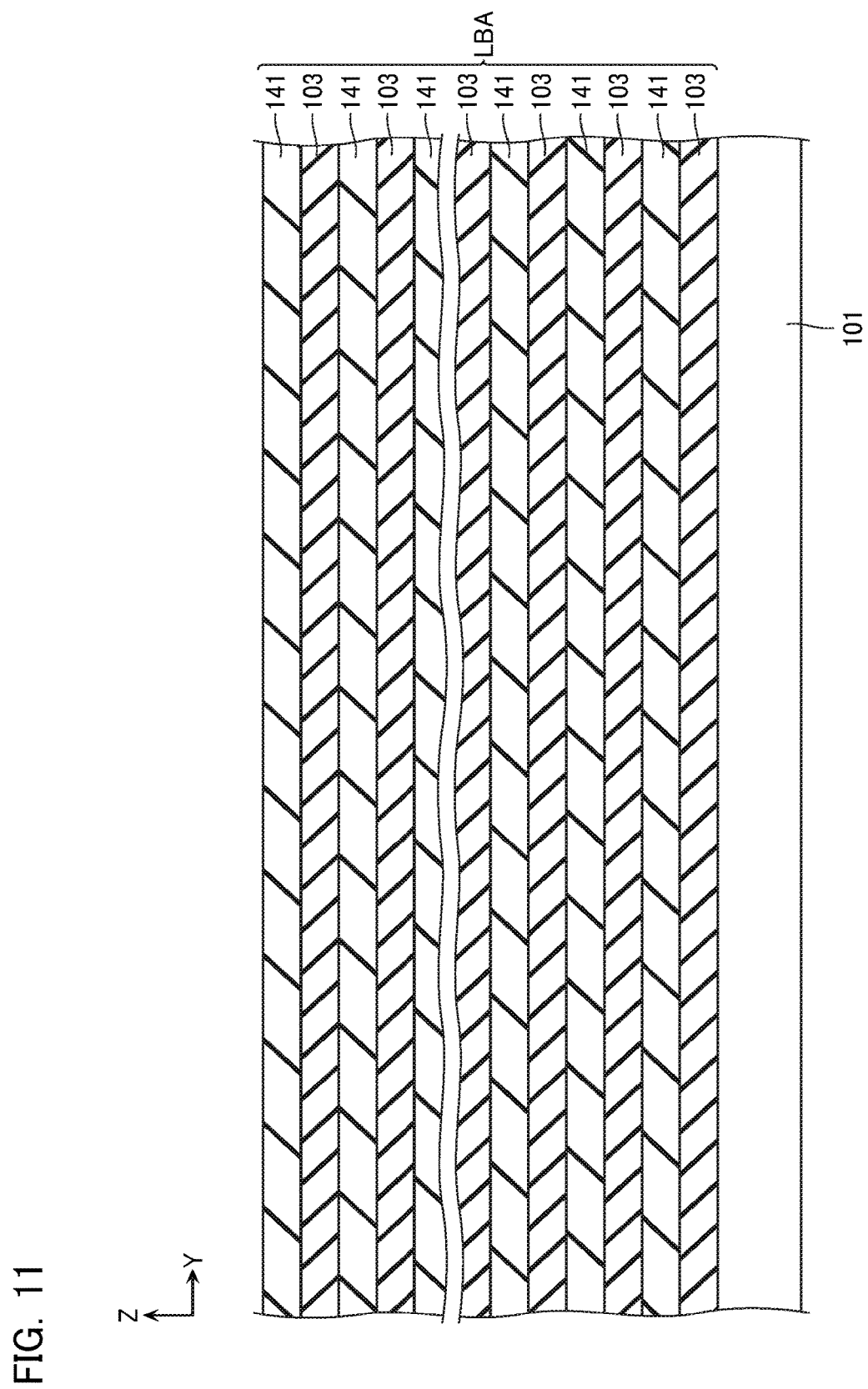
Figure 12:
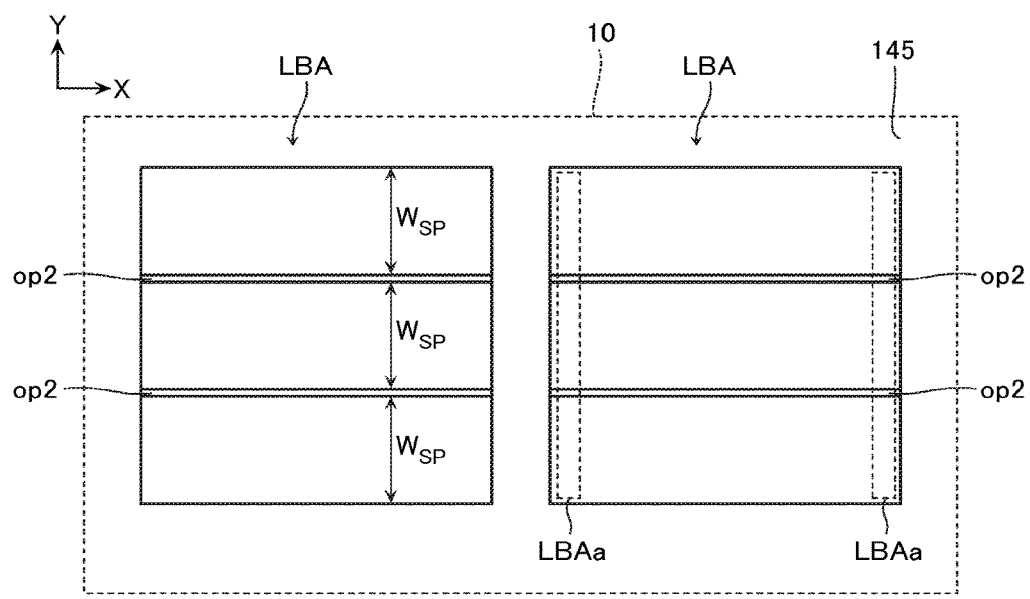
Figure 13:
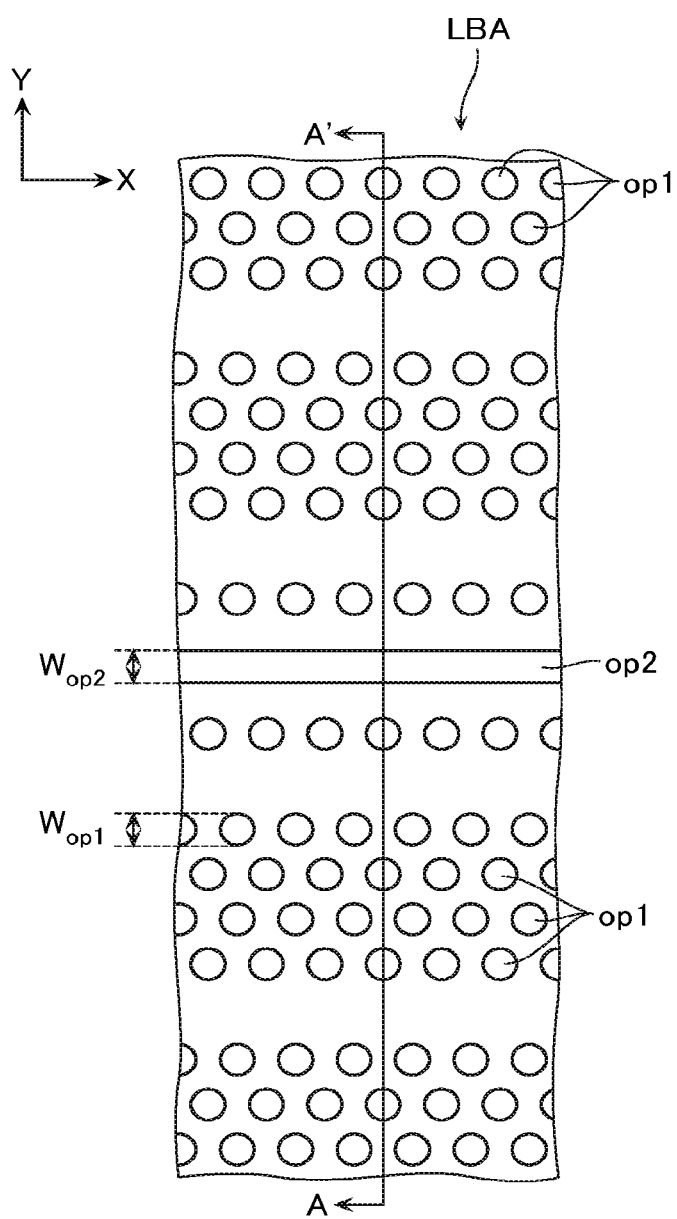

FIGS. 10 to 27 are views showing a method of manufacturing the semiconductor memory device according to the first embodiment. FIGS. 10 and 12 are plan views showing a region 10 which will become the memory die 1 (FIG. 1) on a wafer. FIGS. 13, 19, and 23 show portions corresponding to the enlarged XY plan view of FIG. 6. FIGS. 11, 14-18, 20-22, and 24-27 show portions corresponding to the YZ cross-sectional view of FIG. 7.

As shown in FIG. 10, in the same method of manufacturing, a stacked body LBA extending in the X direction and the Y direction is formed on the region 10 which will become the memory die 1 on the wafer, a portion LBAa of stepped shape is formed at both ends in the X direction of the stacked body LBA, and an insulating film 145 configured of the likes of silicon oxide ($SiO_2$) is formed in a periphery of the stacked body LBA. As shown in FIG. 11, the stacked body LBA comprises a plurality of the inter-layer insulating films 103 and sacrifice films 141 (first films) stacked on the substrate 101. The sacrifice film 141 is configured of the likes of silicon nitride ($Si_3N_4$), for example, and extends in the X direction and the Y direction. Formation of the inter-layer insulating film 103, the sacrifice film 141, and the insulating film 145 is performed by a method such as CVD (Chemical Vapor Deposition), for example.

Figure 14:
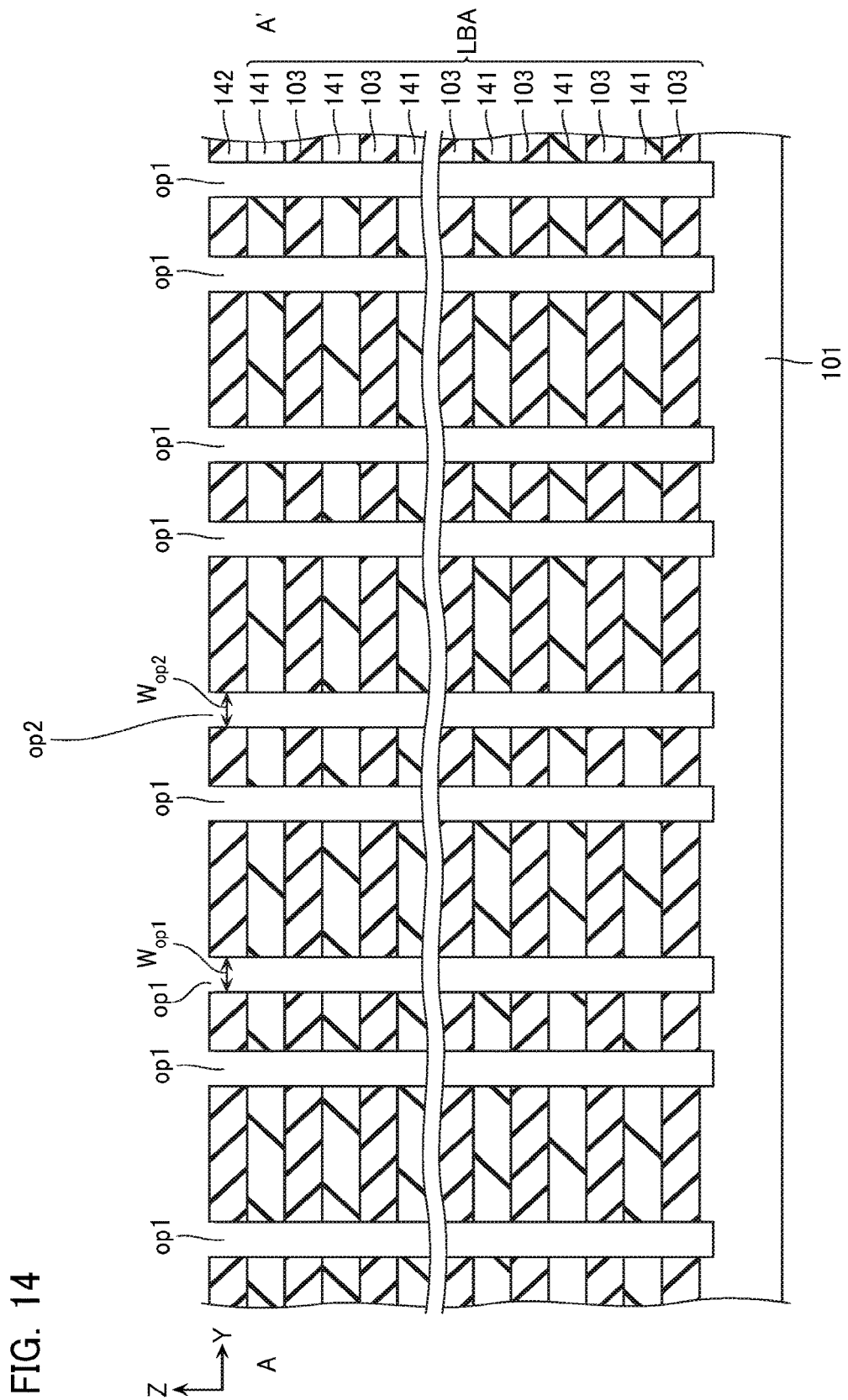

Next, as shown in FIGS. 12 to 14, a plurality of first openings op1 and second openings op2 are formed in the stacked body LBA. Note that for reasons of scale, and so on, the first opening op1 is not shown in FIG. 12. The first openings op1 are through holes that extend in the Z direction and penetrate the plurality of inter-layer insulating films 103 and sacrifice films 141 stacked on the substrate 101, to expose an upper surface of the substrate 101, and are provided staggered. The second openings op2 are trenches that extend in the Z direction and the X direction and divide in the Y direction the plurality of inter-layer insulating films 103 and sacrifice films 141 stacked on the substrate 101, to expose the upper surface of the substrate 101, and are arranged at the first intervals $W_{SP}$ in the Y direction. Note that a width $W_{op2}$ in the Y direction of the second opening op2 may be about the same as a width $W_{op1}$ in the Y direction of the first opening op1, or may be narrower than this.

The first opening op1 and the second opening op2 are formed in a batch, for example. For example, first, the insulating film 142 is formed on an upper surface of the stacked body LBA, and an unshown resist is formed on an upper surface of the insulating film 142. Next, lithography is performed and patterns corresponding to the first opening op1 and the second opening op2 are formed in a batch in the resist. Next, a patterned portion of the resist is removed, part of the insulating film 142 is removed using this resist as a mask, and the resist is detached. Next, RIE (Reactive Ion Etching) is performed using the insulating film 142 as a mask, whereby the first opening op1 and the second opening op2 are formed.

Note that it is possible, for example, for lithography to be performed separately for the pattern corresponding to the first opening op1 and the pattern corresponding to the second opening op2, and for RIE to be performed in a batch for the first opening op1 and the second opening op2. Furthermore, RIE for first opening op1 formation and RIE for second opening op2 formation may be performed separately.

Figure 15:
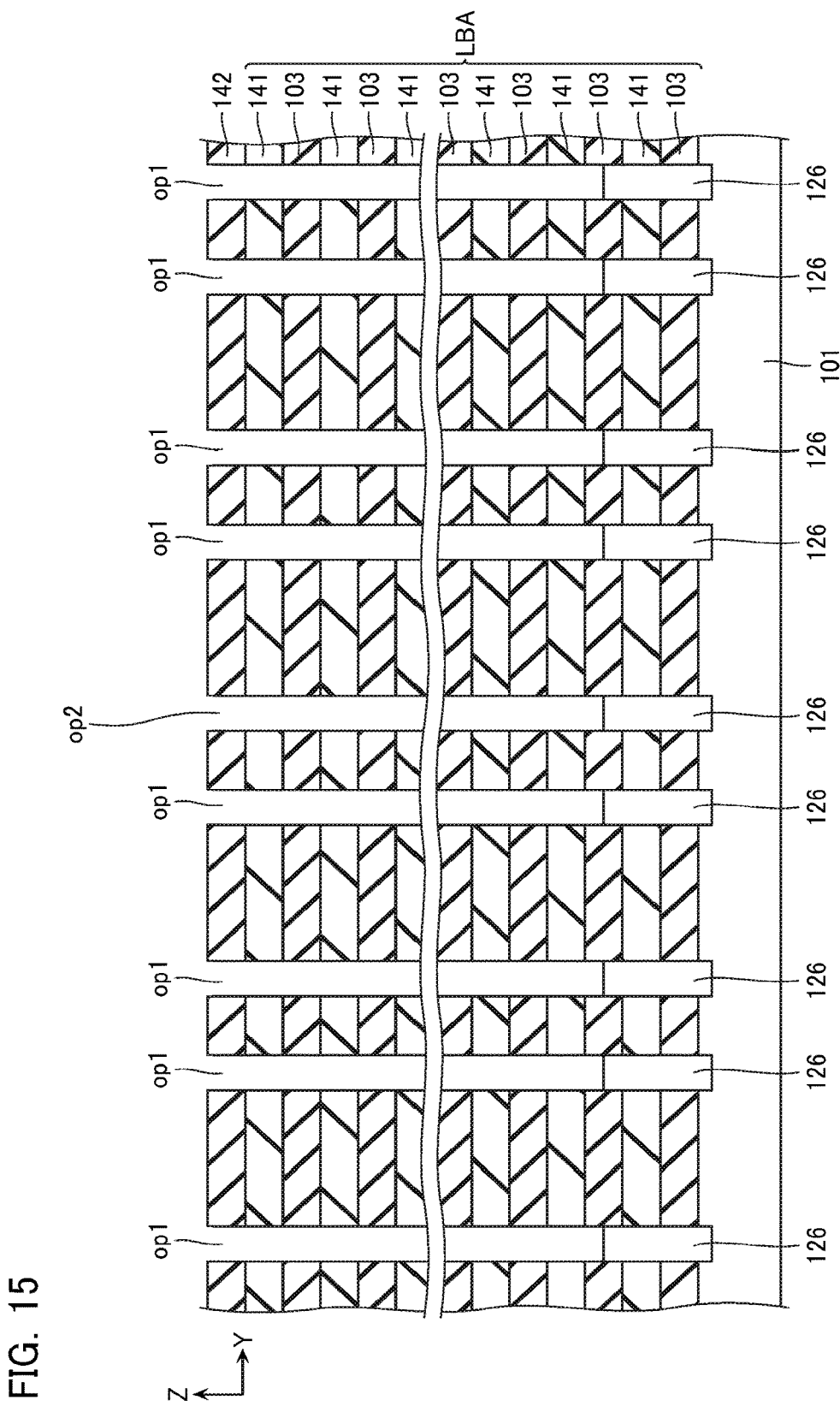

Next, as shown in FIG. 15, the third semiconductor layer 126 is formed on bottom surfaces of the first opening op1 and the second opening op2, by the likes of an epitaxial growth method.

Figure 16:
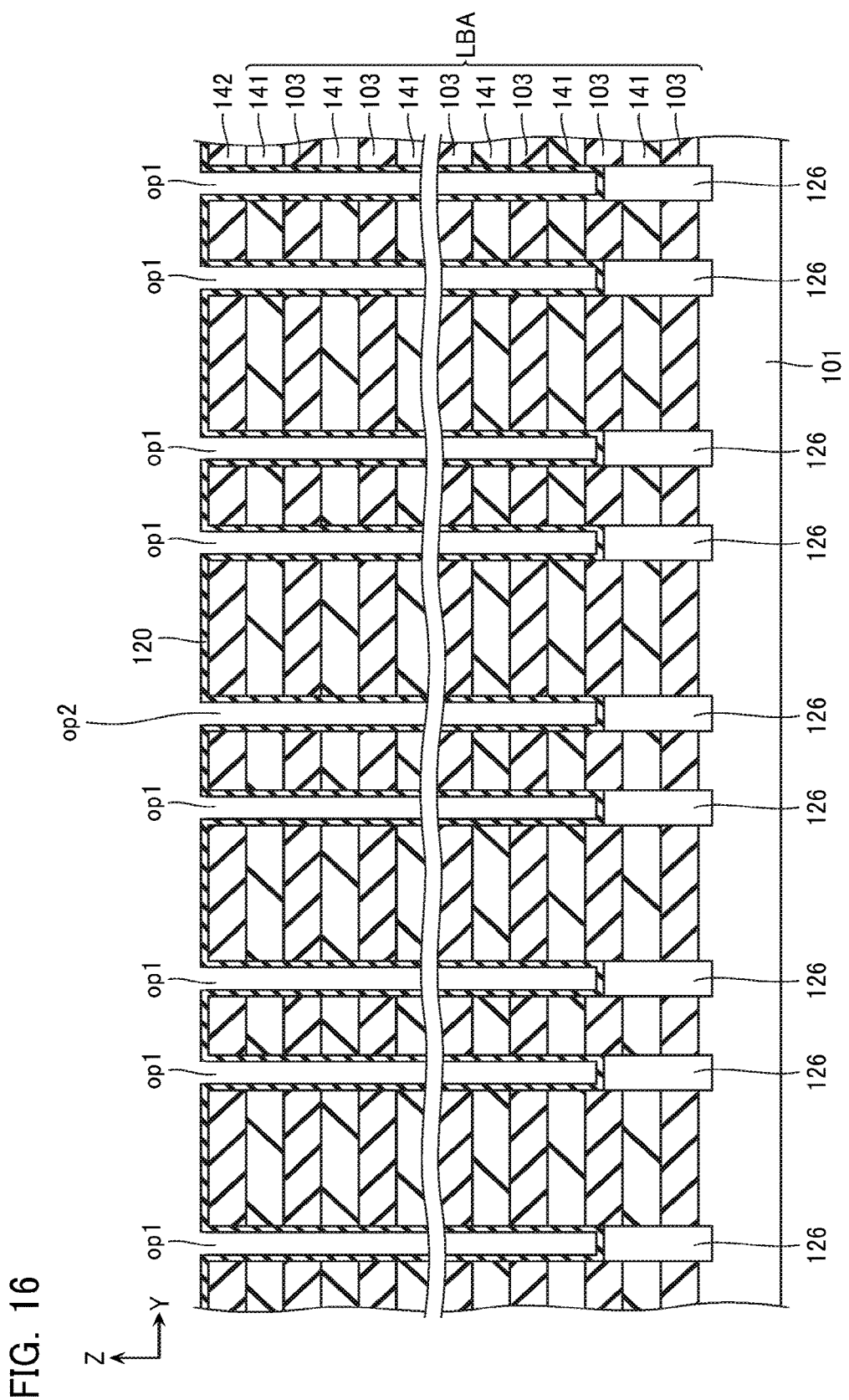

Next, as shown in FIG. 16, the memory insulating film 120 is formed on inner walls of the first opening op1 and the second opening op2, on an upper surface of the third semiconductor layer 126, and on an upper surface of the insulating film 142, by the likes of CVD. Formation of the memory insulating film 120 is performed by sequentially forming the block insulating film 125, the charge accumulation film 124, and the tunnel insulating film 123. Note that after the memory insulating film 120 has been formed, amorphous-state silicon (Si), or the like, may be further formed.

Figure 17:
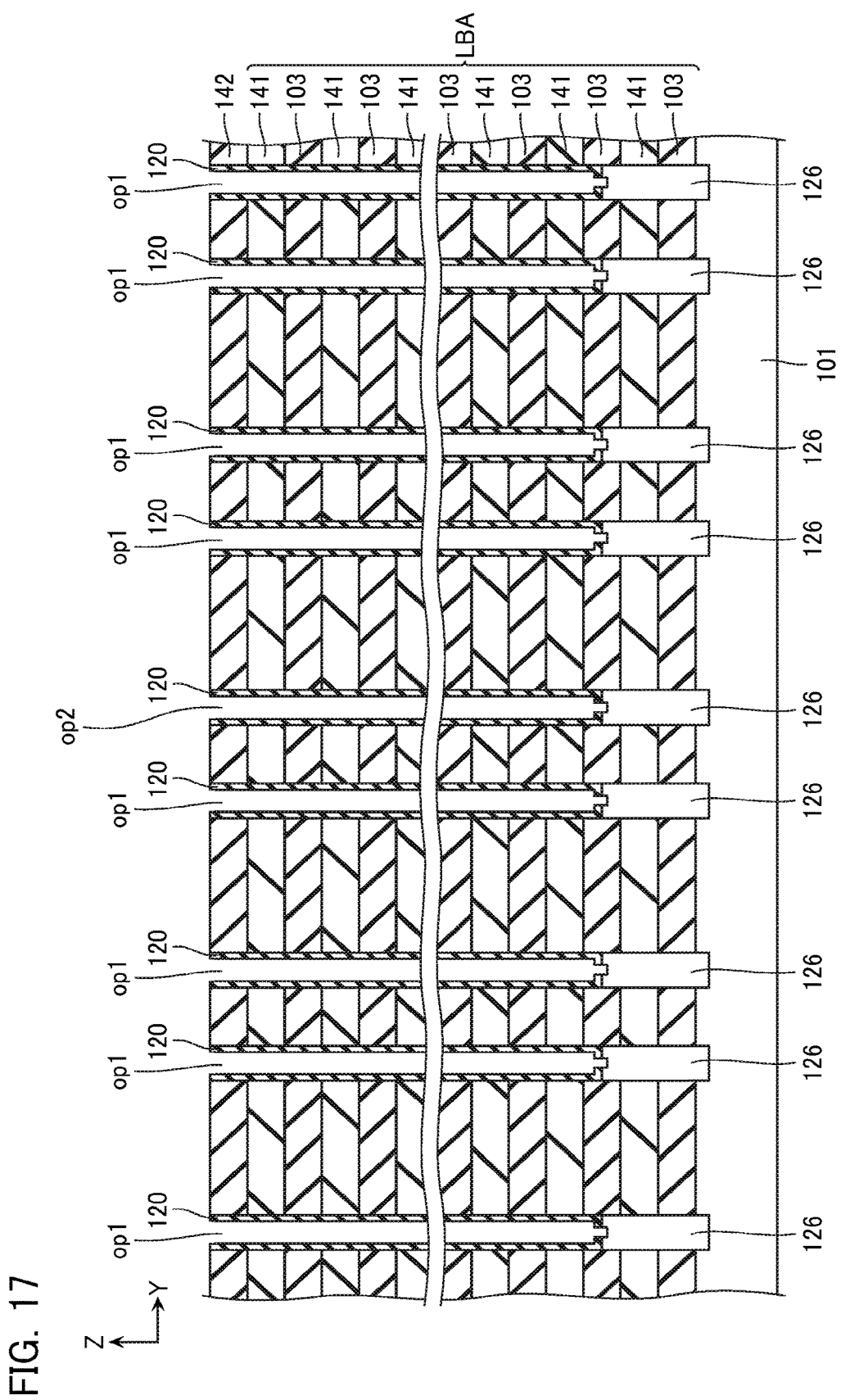

Next, as shown in FIG. 17, a portion of the memory insulating film 120 covering the upper surface of the third semiconductor layer 126 and a portion of the memory insulating film 120 covering the upper surface of the insulating film 142 are removed by the likes of RIE.

Figure 18:
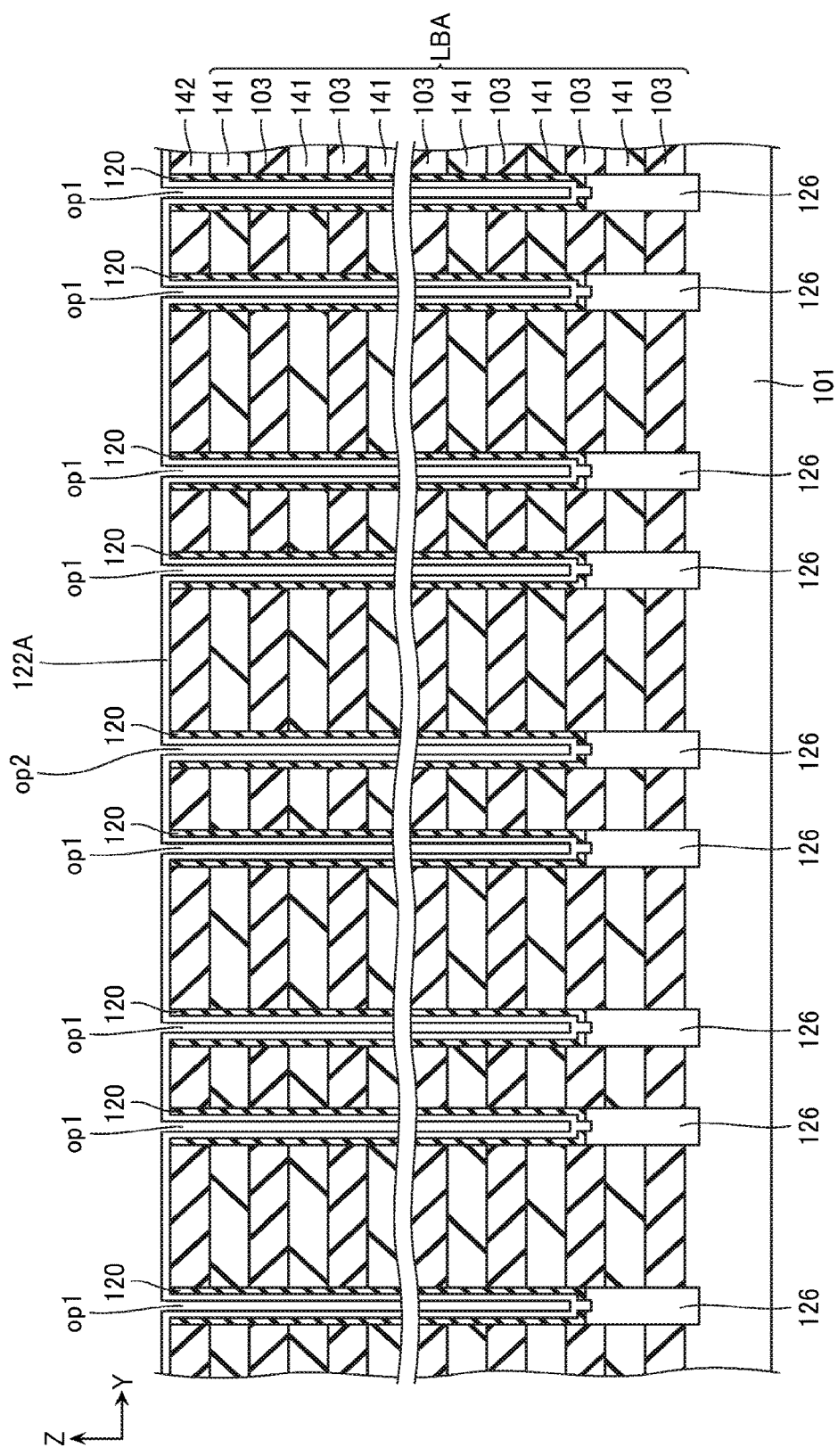
Figure 19:
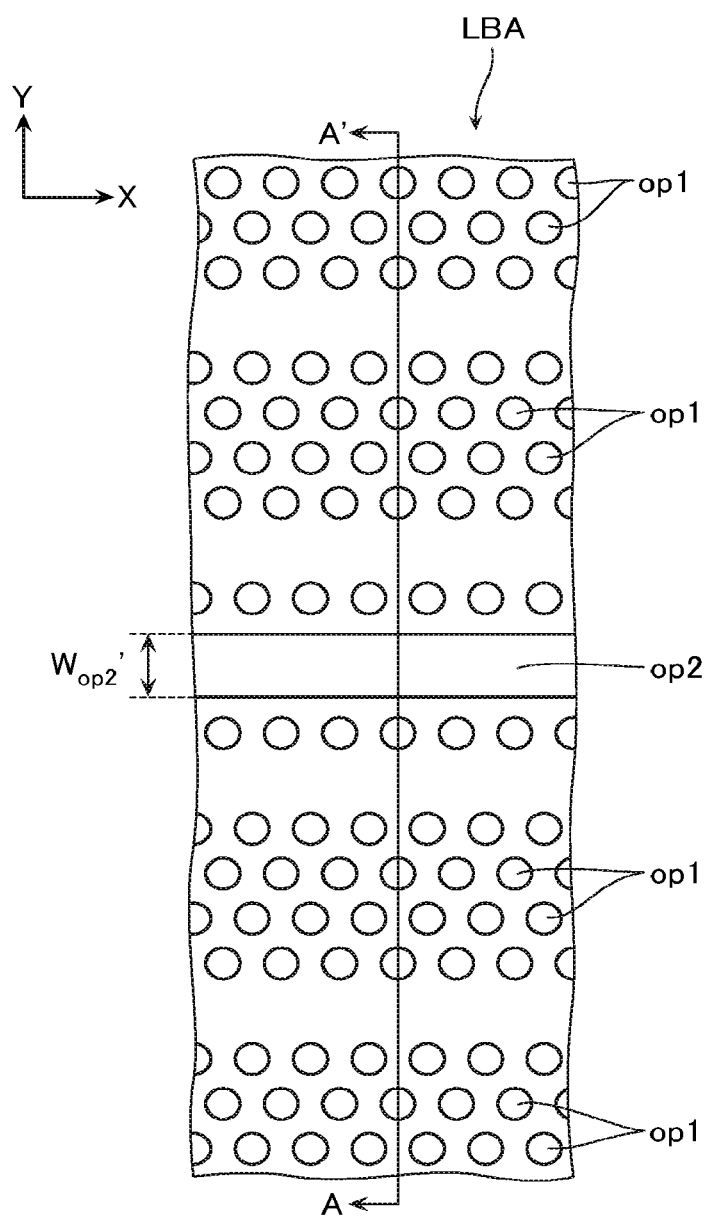

Next, as shown in FIG. 18, an amorphous semiconductor layer 122A is formed on an inner wall of the memory insulating film 120, on the upper surface of the third semiconductor layer 126, and on the upper surface of the insulating film 142, by a method such as CVD. The amorphous semiconductor layer 122A is formed thinly enough for the first opening op1 and the second opening op2 not to be embedded. The amorphous semiconductor layer 122A is a film, forming the first semiconductor layer 122, configured of, for example, amorphous silicon (Si).

Figure 20:
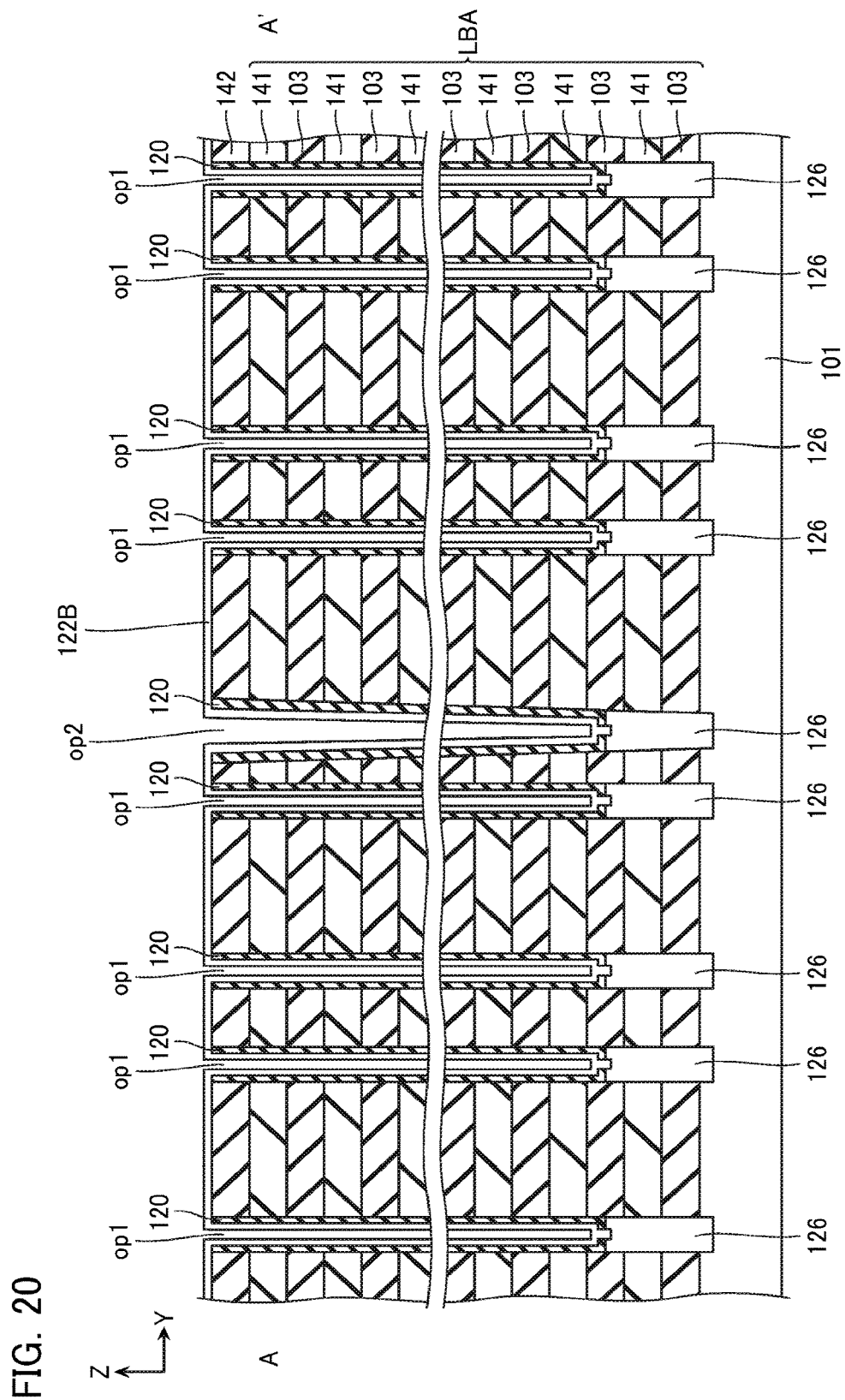

Next, as shown in FIGS. 19 and 20, heat treatment is performed, and a crystalline structure of the silicon in the amorphous semiconductor layer 122A is reformed to form a semiconductor layer 122B (FIG. 20) configured of polycrystalline-state silicon. The semiconductor layer 122B is obtained by, for example, performing ordinary annealing at 850° C. for 30 minutes and then further performing RTA (Rapid Thermal Annealing). Note that in a heat treatment step, the width in the Y direction of the second opening op2 sometimes broadens to $W_{op2}$ ($W_{op2}$ is larger than $W_{op2}$ shown in FIG. 14). This is because in each portions of the stacked body LBA divided by the second opening op2 (refer to FIG. 12), each of the sacrifice films 141 contracts in a direction (for example, the Y direction) intersecting the direction in which the second opening op2 extends. Note that since the first opening op1 is a through hole that does not divide the stacked body LBA (refer to FIG. 19), the width in the Y direction of the first opening op1 does not broaden.

Figure 21:
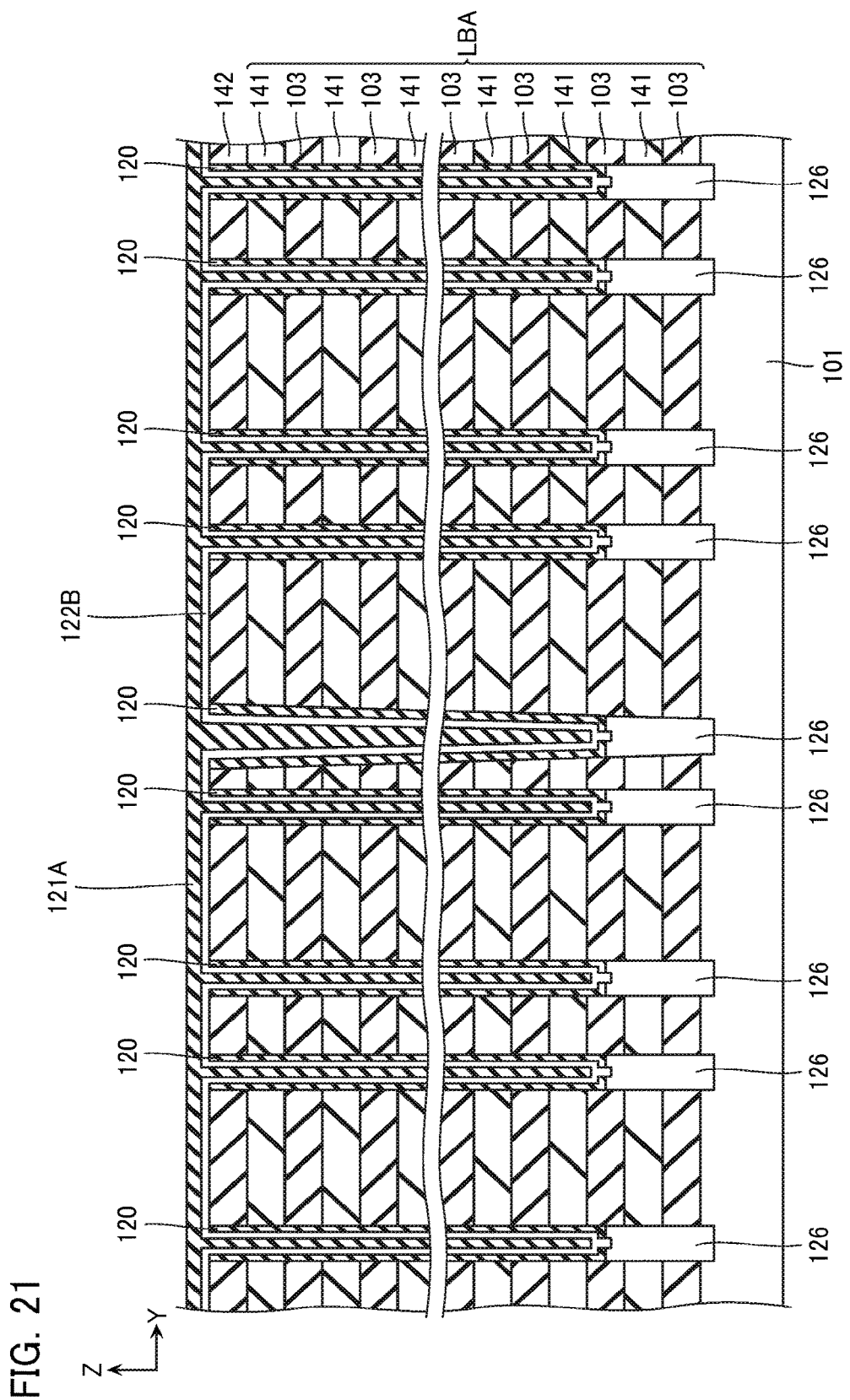

Next, as shown in FIG. 21, an insulating film 121A is formed on the insides of the first opening op1 and the second opening op2, and on an upper surface of the semiconductor layer 122B. The insulating film 121A is film forming the core insulating film 121, and is configured of the likes of silicon oxide (SiO$_2$), for example. The insulating film 121A is formed by a method such as ALD (Atomic Layer Deposition), for example.

Figure 22:
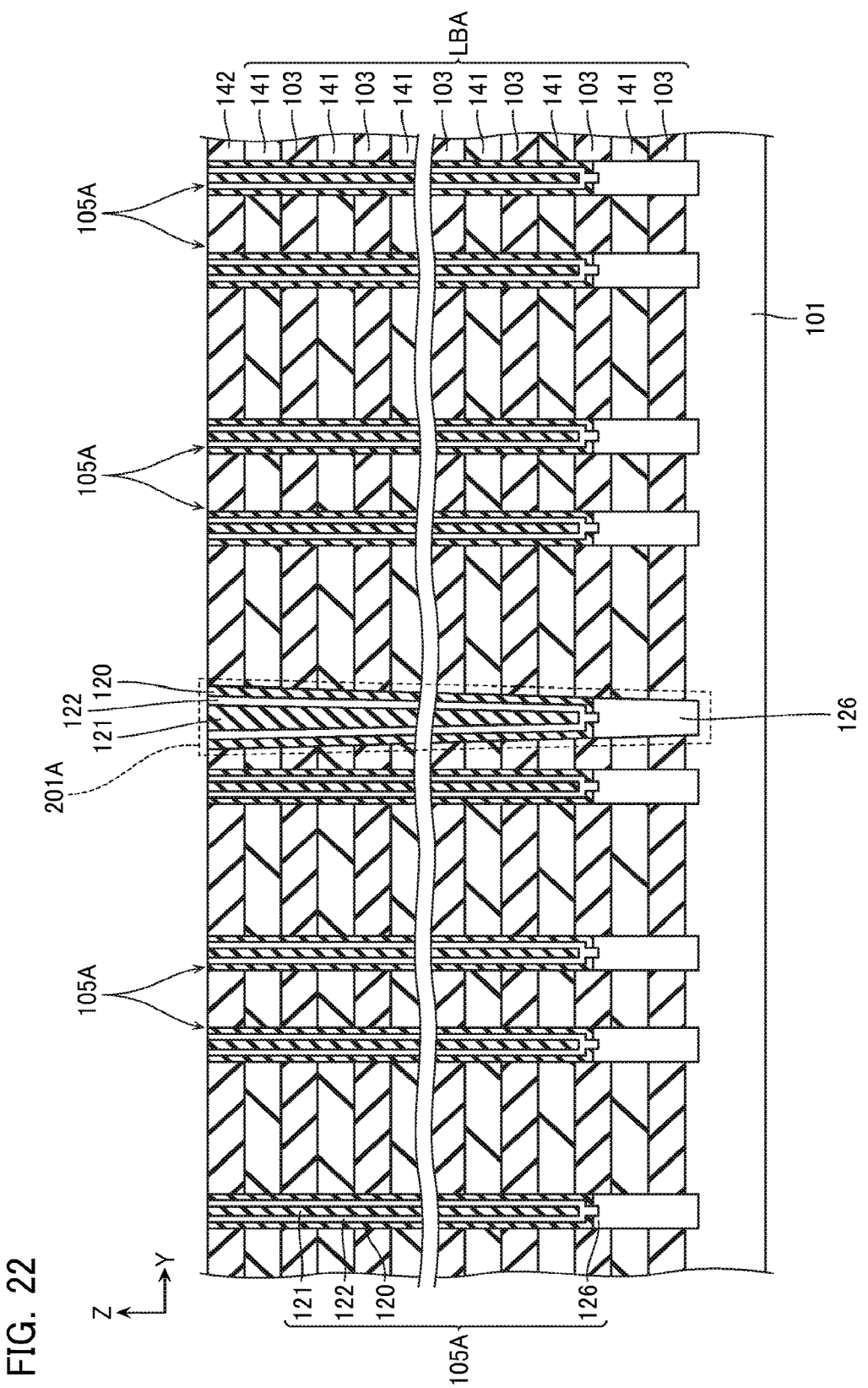
Figure 23:
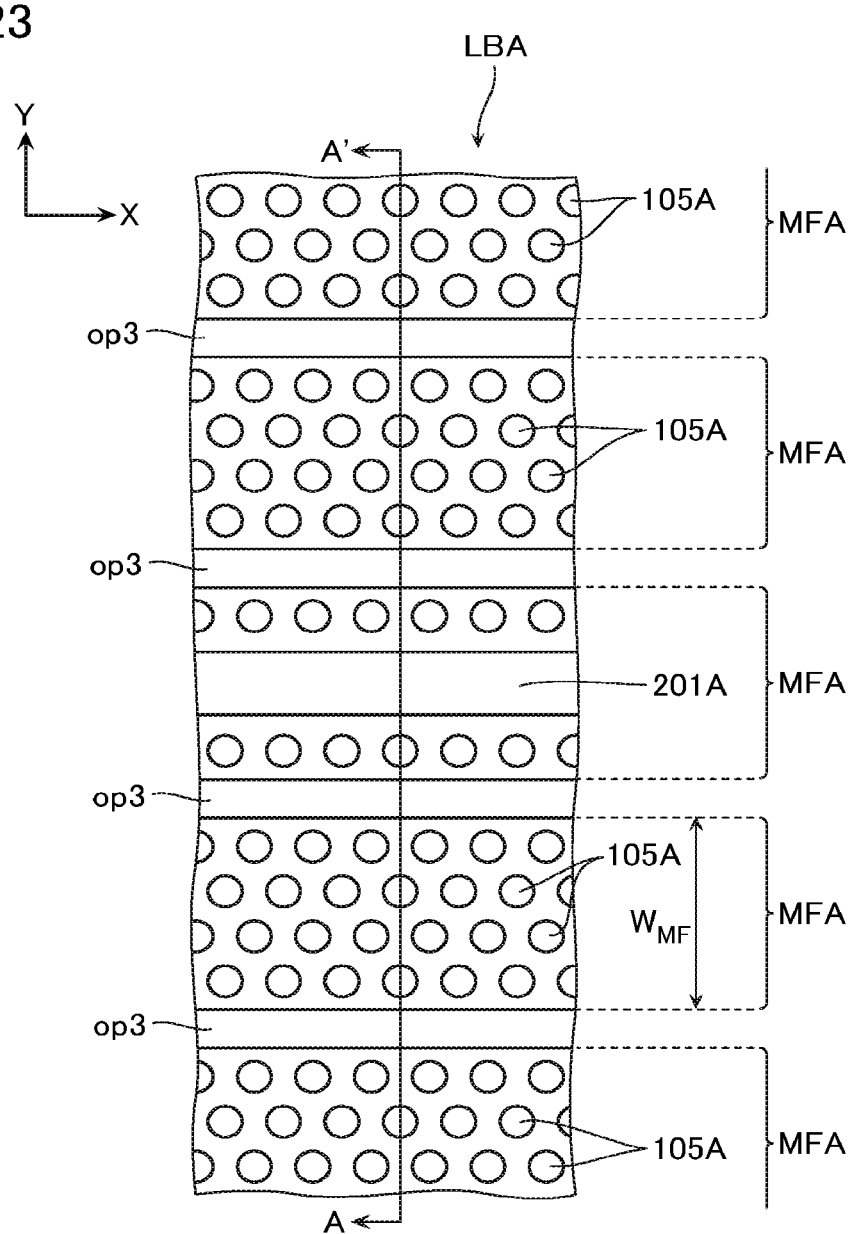

Next, as shown in FIG. 22, portions of the semiconductor layer 122B and the insulating film 121A covering the upper surface of the insulating film 142 are removed. This step is performed by the likes of etching, for example. As a result, the first semiconductor layer 122 and the core insulating film 121 are formed on the insides of the first opening op1 and the second opening op2. Hereafter, a structure provided on the inside of the first opening op1 will be called a columnar body 105A, and a structure provided on the inside of the second opening op2 will be called a structure 201A.

Figure 24:
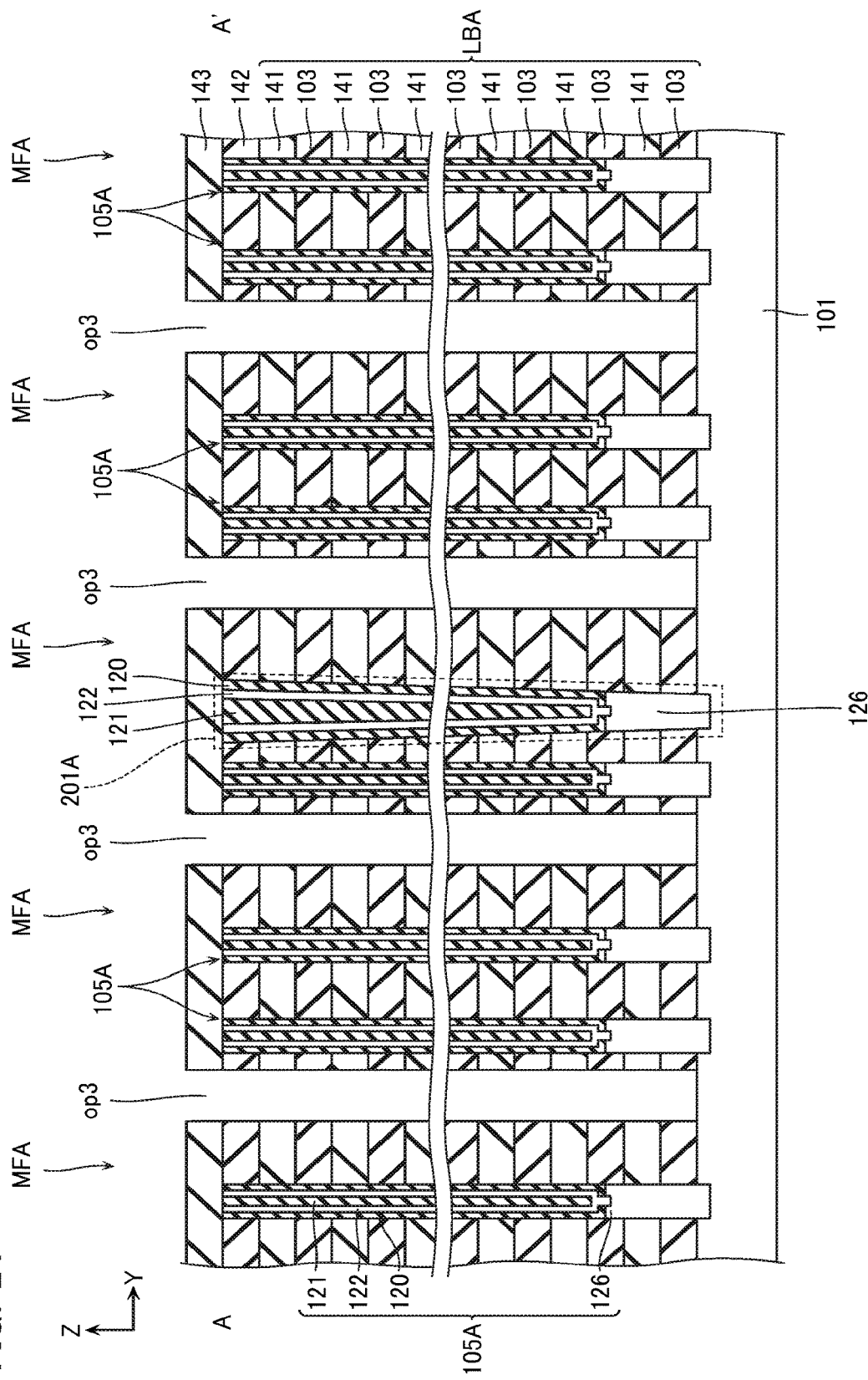

Next, as shown in FIGS. 23 and 24, third openings op3 are formed at the second intervals W$_{MF}$ in the Y direction, and the stacked body LBA is divided in the Y direction to form a finger structure MFA forming the memory finger MF. The third opening op3 is a trench that extends in the Z direction and the X direction, penetrates the plurality of inter-layer insulating films 103 and sacrifice films 141 stacked on the substrate 101, and divides these films in the Y direction to expose the upper surface of the substrate 101. During formation of the third opening op3, the insulating film 143 is formed on upper surfaces of the insulating film 142, the columnar body 105A, and the structure 201A, for example. The insulating film 143 has a trench in a portion corresponding to the third opening op3. Next, RIE is performed using the insulating film 143 as a mask, whereby the opening op3 is formed.

Figure 25:
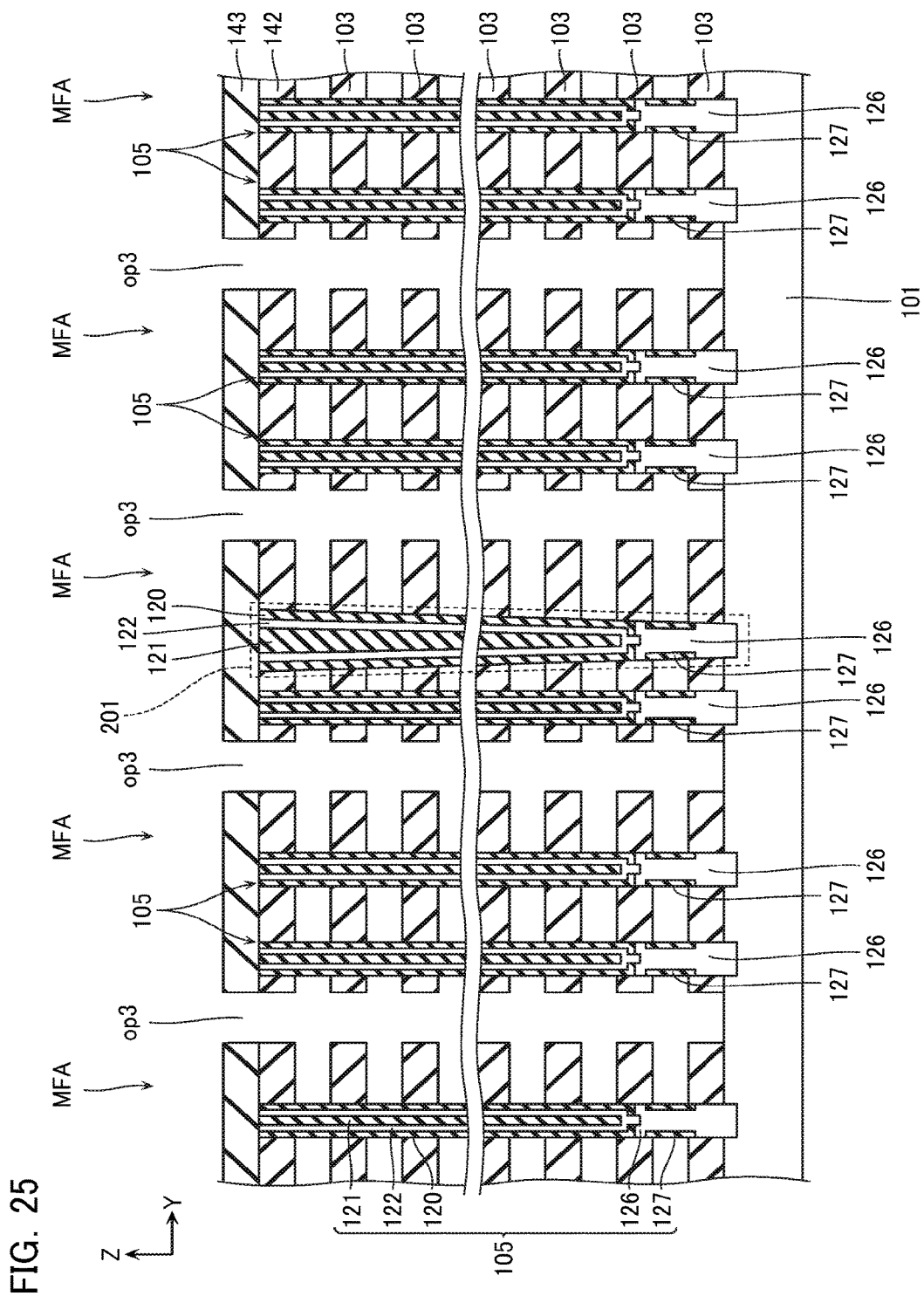

Next, as shown in FIG. 25, the sacrifice film 141 is removed via the third opening op3. The sacrifice film 141 is removed by the likes of wet etching using phosphoric acid, for example.

Next, oxidation treatment is performed via the third opening op3, and the insulating film 127 is formed in a side surface of the third semiconductor layer 126. As a result, the memory columnar body 105 and the first structure 201 are formed.

Figure 26:
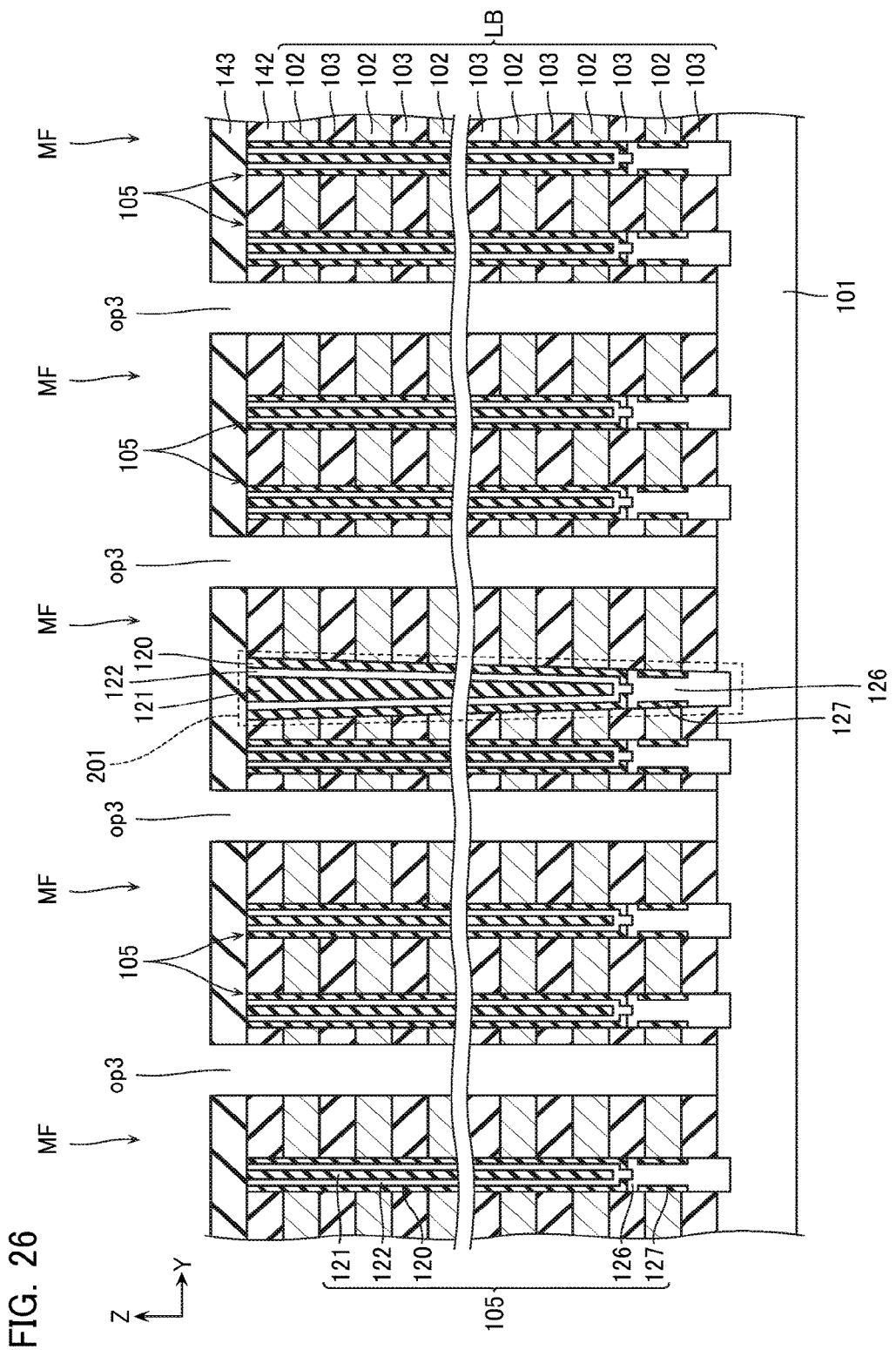

Next, as shown in FIG. 26, the first conductive film 102 facing the first semiconductor layer 122 via the memory insulating film 120, is formed. During formation of the first conductive film 102, tungsten (W), and so on, is formed on an upper surface, lower surface, and side surface of the inter-layer insulating film 103, and on a side surface of the memory insulating film 120, via the third opening op3, by the likes of CVD, for example. Next, a portion formed on the side surface of the inter-layer insulating film 103, of the formed tungsten (W), and so on, is selectively removed by the likes of wet etching. As a result, the stacked body LB is formed, and the memory finger MF is formed.

Figure 27:
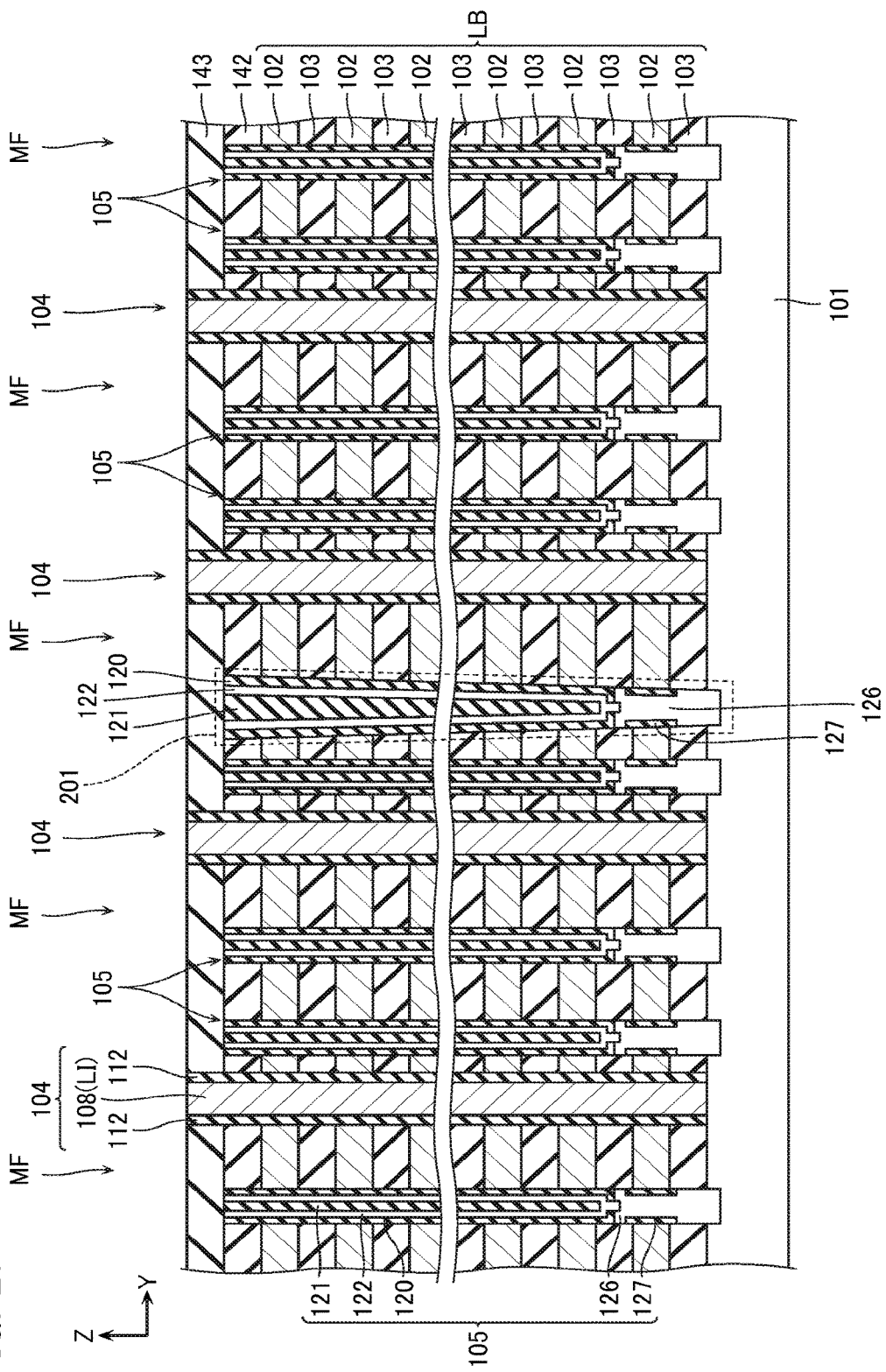

Next, as shown in FIG. 27, the second structure 104 is formed on the inside of the third opening op3. For example, the fourth insulating film 112 is formed on an inner wall and bottom surface of the third opening op3 by the likes of CVD, a portion of the fourth insulating film 112 provided on the bottom surface of the third opening op3 is removed by the likes of RIE, and the second conductive film 108 is formed on the inside of the third opening op3.

Subsequently, as shown in FIG. 7, the insulating film 144 is formed on upper surfaces of the insulating film 143 and the second structure 104, part of the insulating film 143 is removed to form an opening using this insulating film 144 as a mask, and the conductive film 114 (CH) is formed on the inside of this opening. Moreover, as shown in FIG. 3, formation of the conductive films 106 (BL), 107 (SL), and 109, and so on, is performed. As a result, the semiconductor memory device according to the first embodiment is completed.

[Semiconductor Memory Device According to Comparative Example]

Next, a semiconductor memory device according to a comparative example will be described. The semiconductor memory device according to the comparative example is configured substantially similarly to the semiconductor memory device of FIG. 1, excluding points that its memory plane MP is not divided into sub-planes SP and that it does not include the first structure 201, hence illustration of its structure and a detailed description thereof will be omitted.

[Method of Manufacturing According to Comparative Example]

Figure 28:
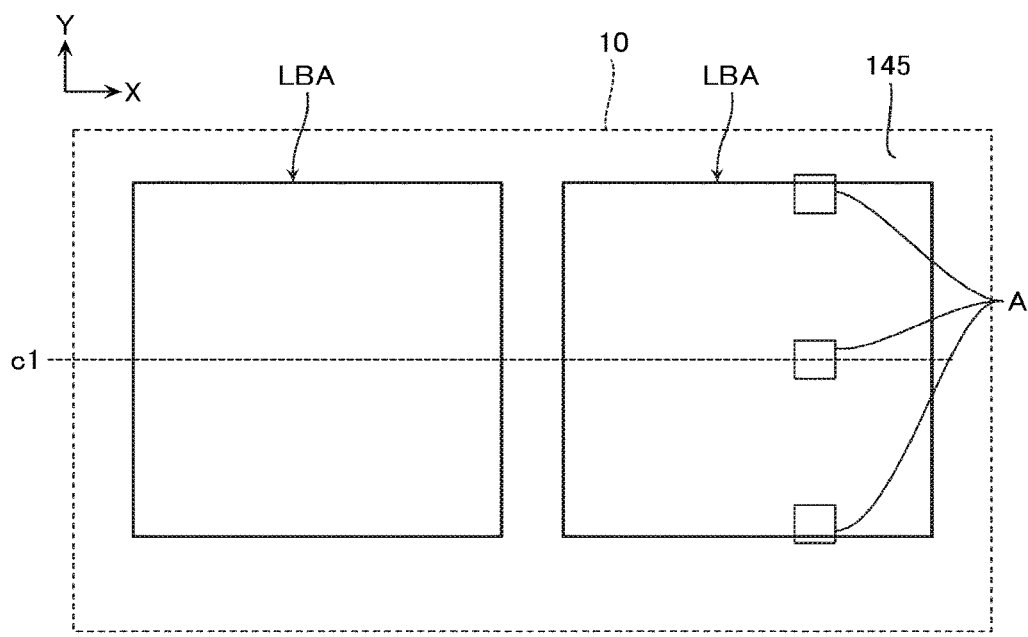
FIGS. 28 to 38 are views showing a method of manufacturing a semiconductor memory device according to a comparative example.
Figure 29:
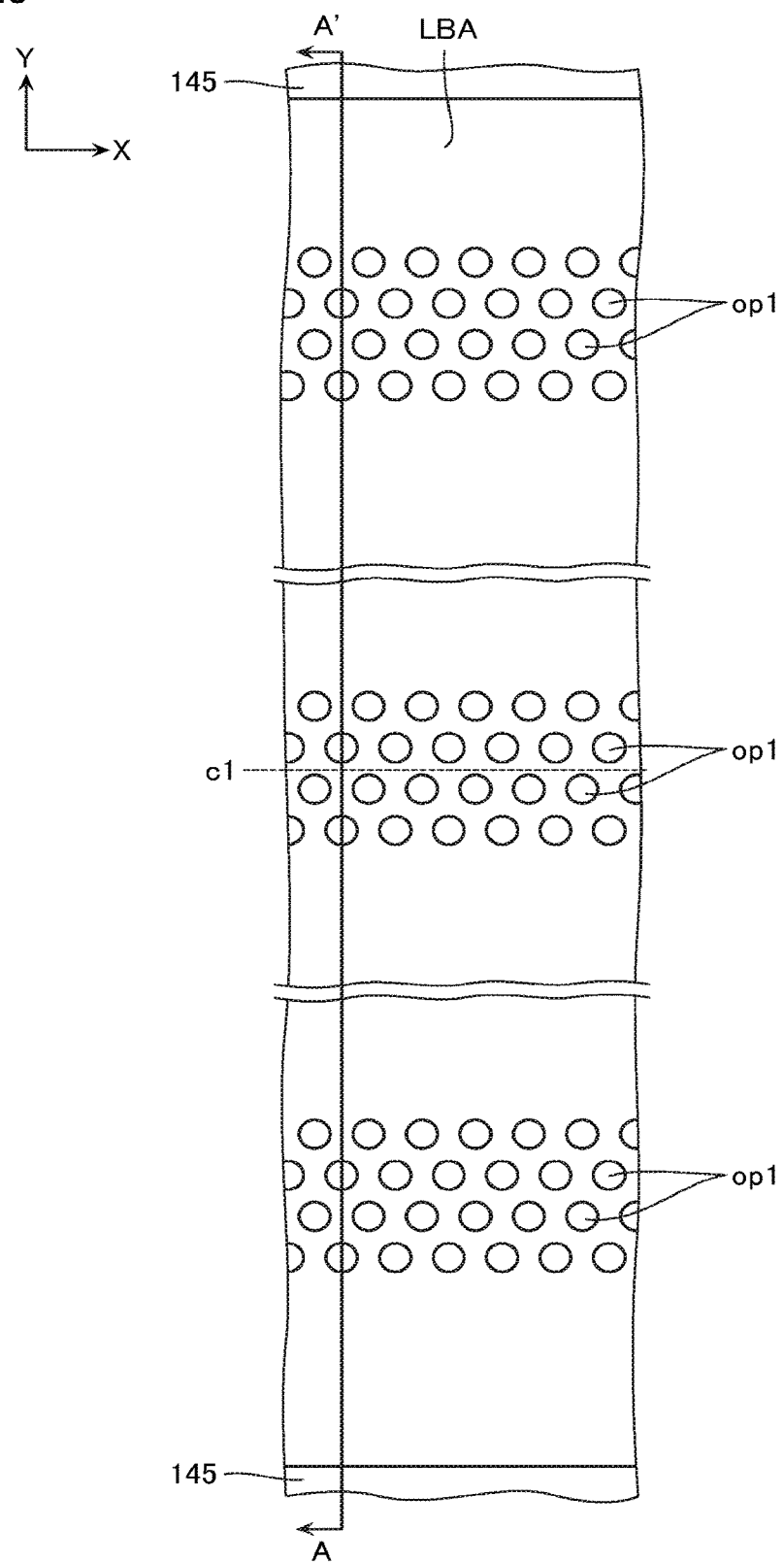
Figure 30:
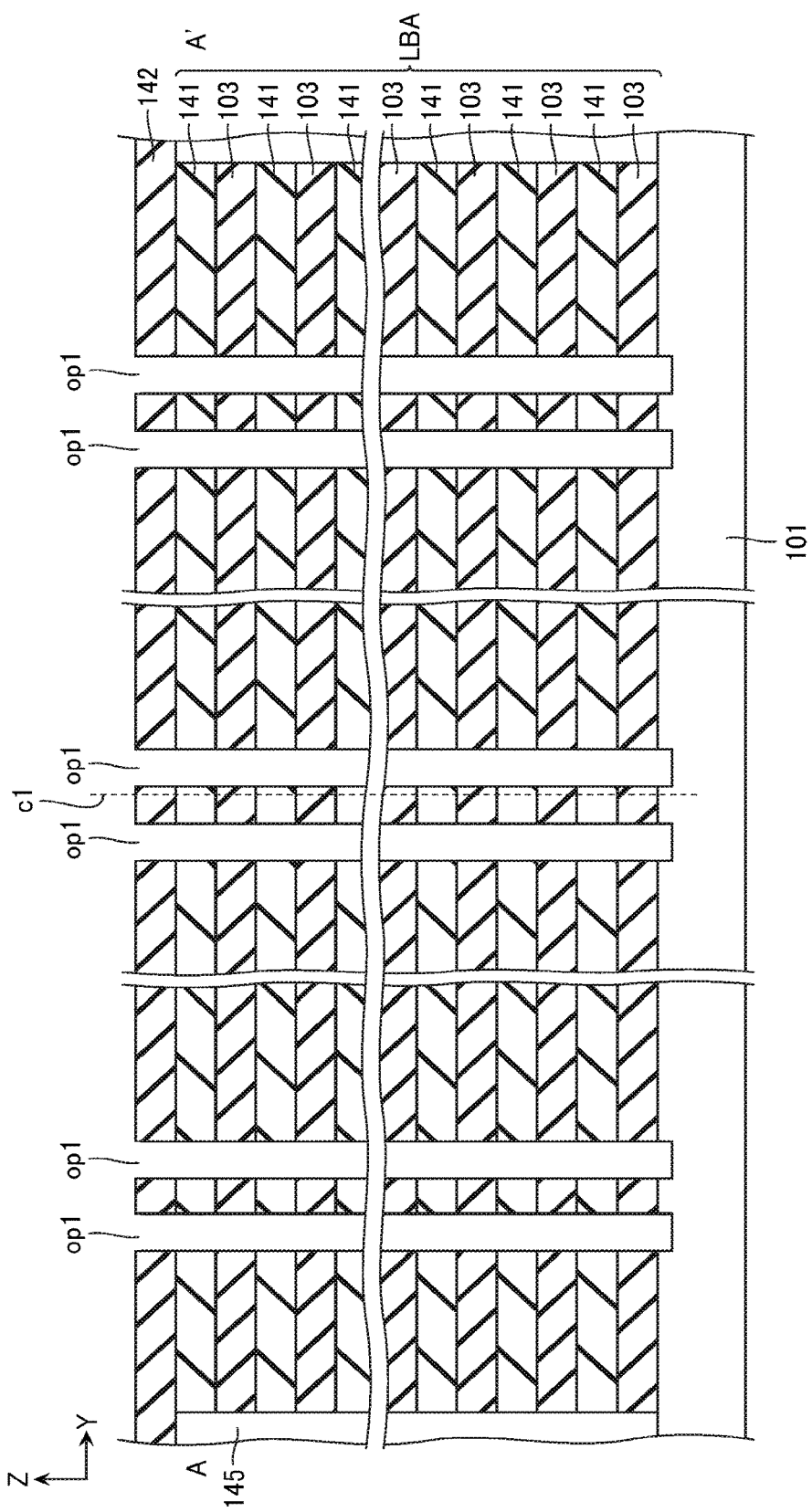
Figure 31:
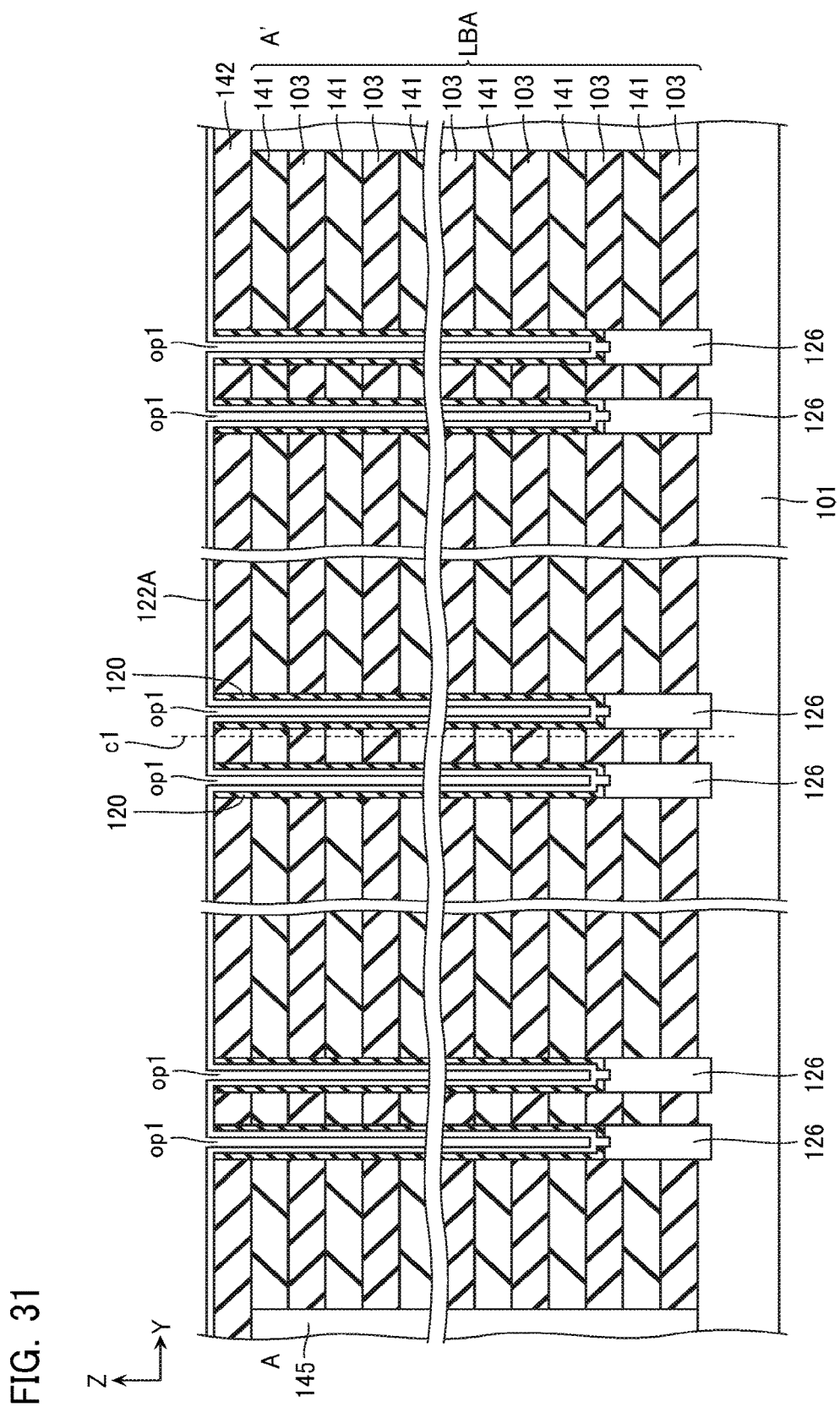
Figure 32:
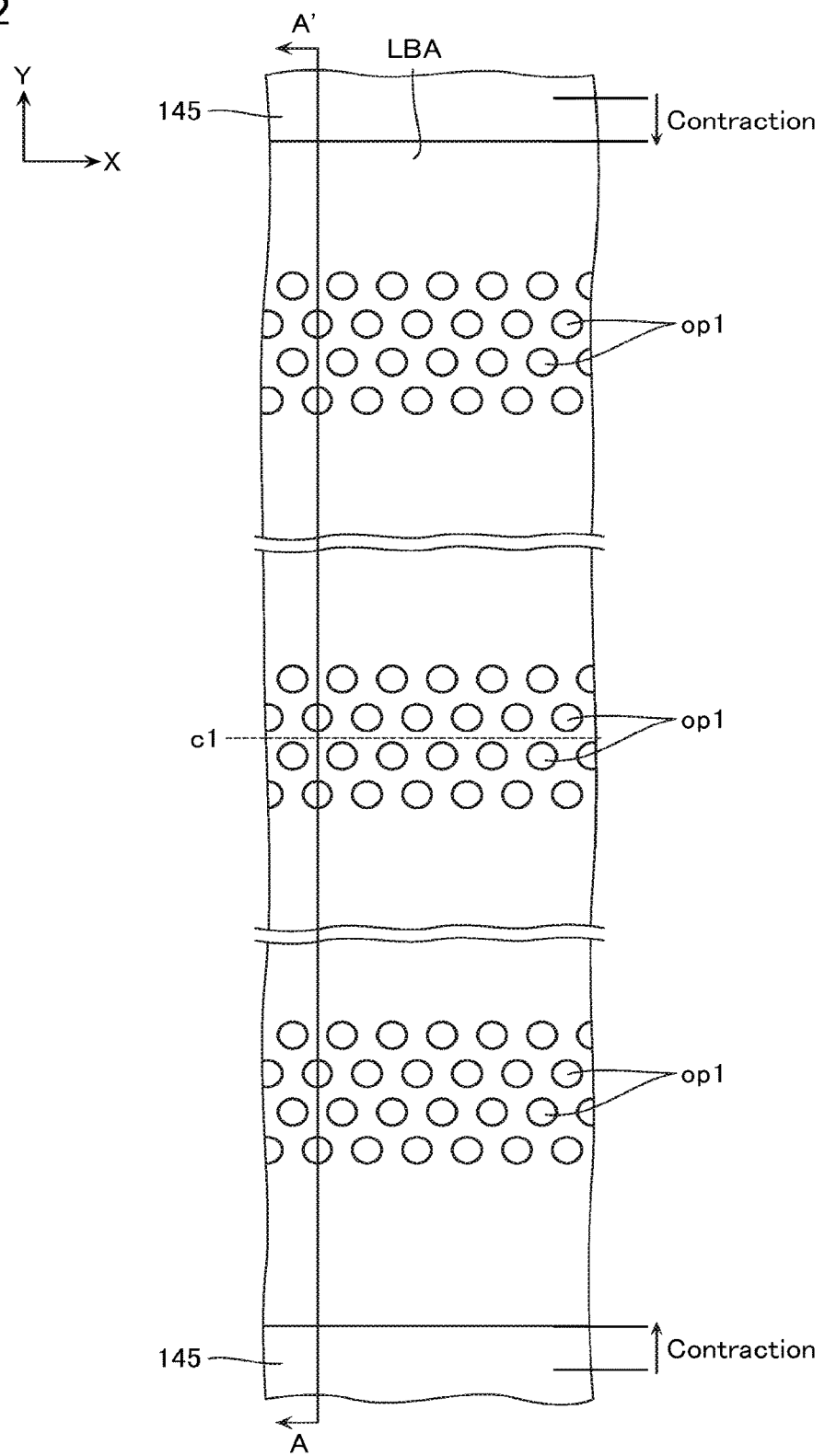
Figure 33:
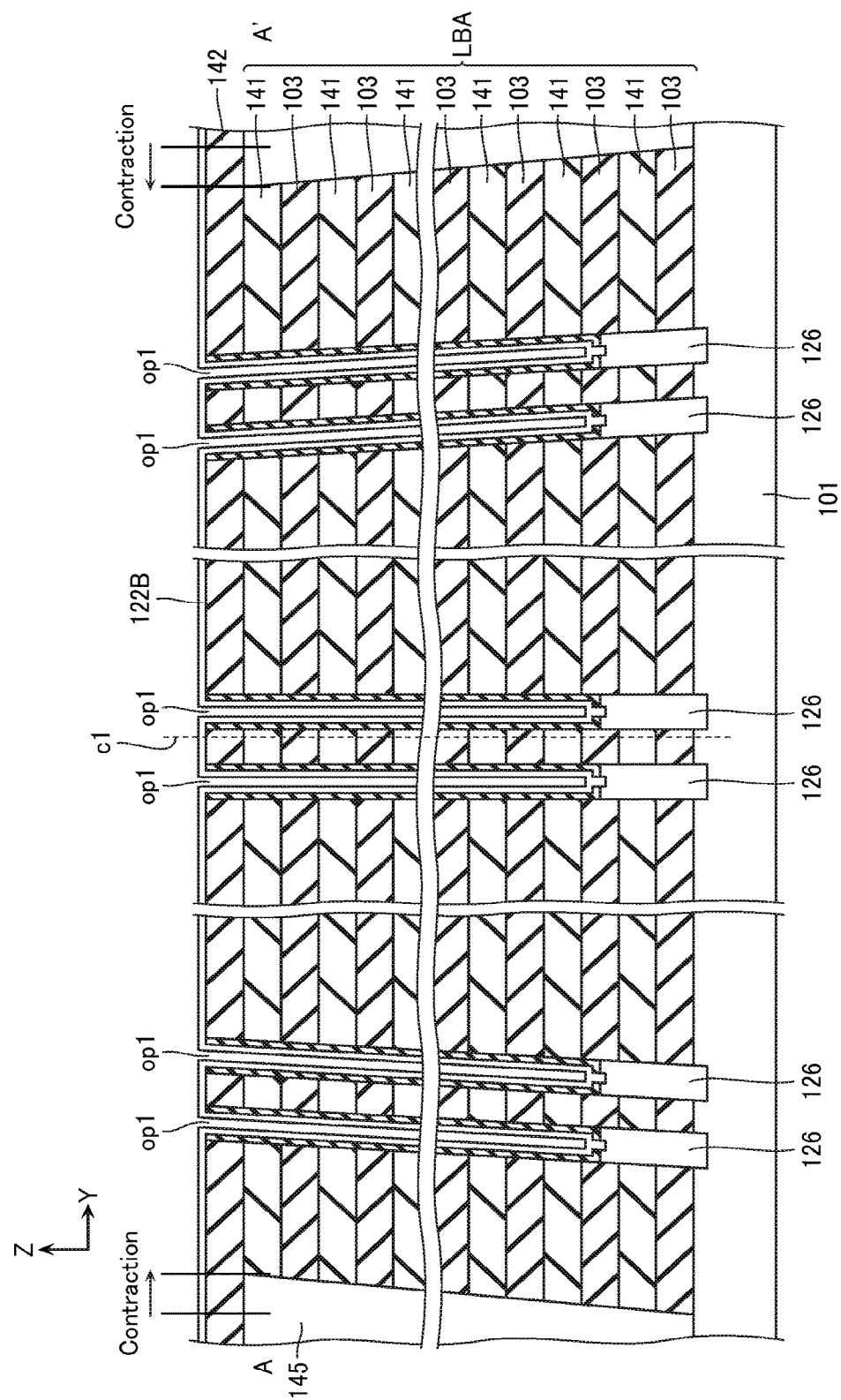
Figure 34:
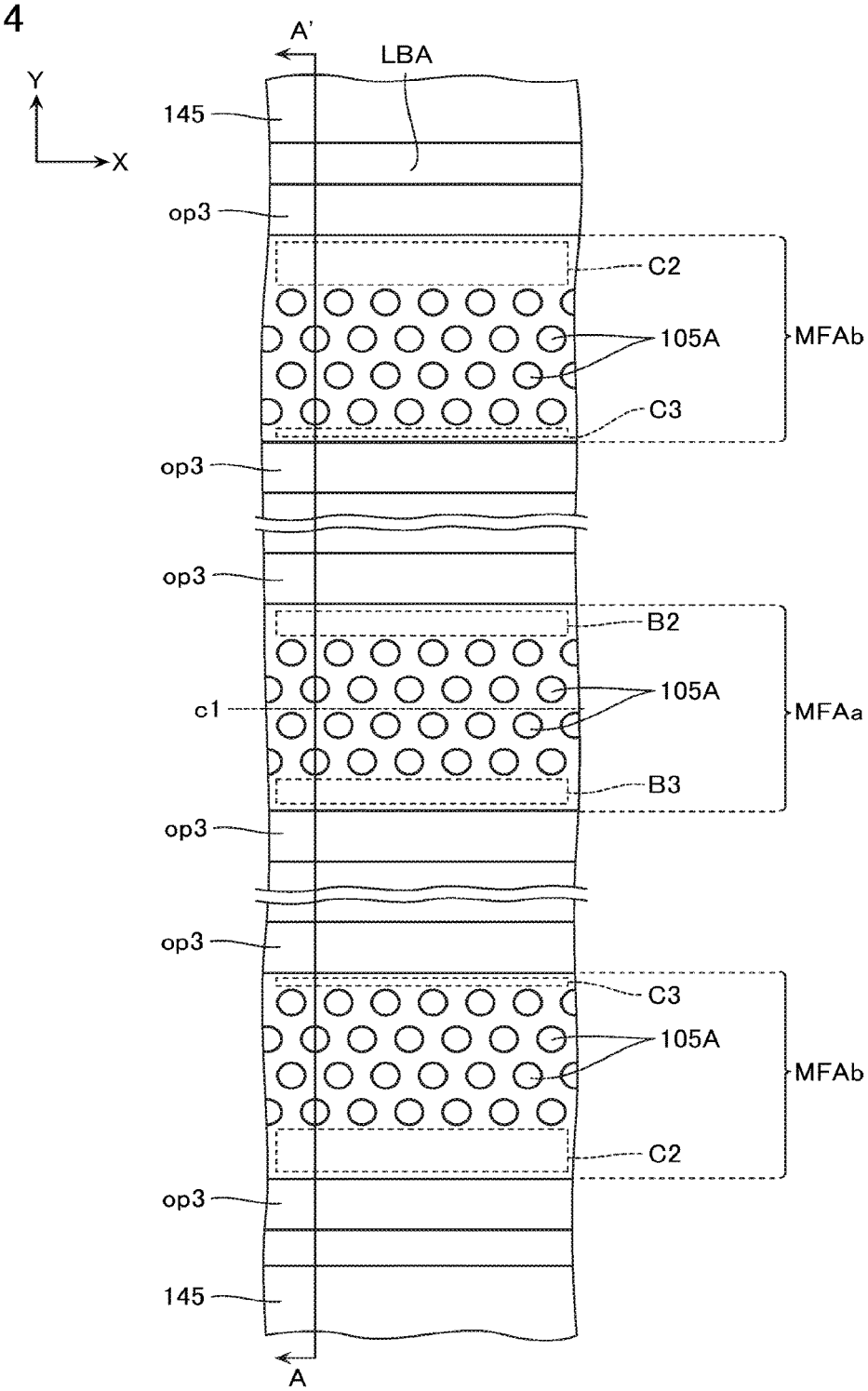
Figure 35:
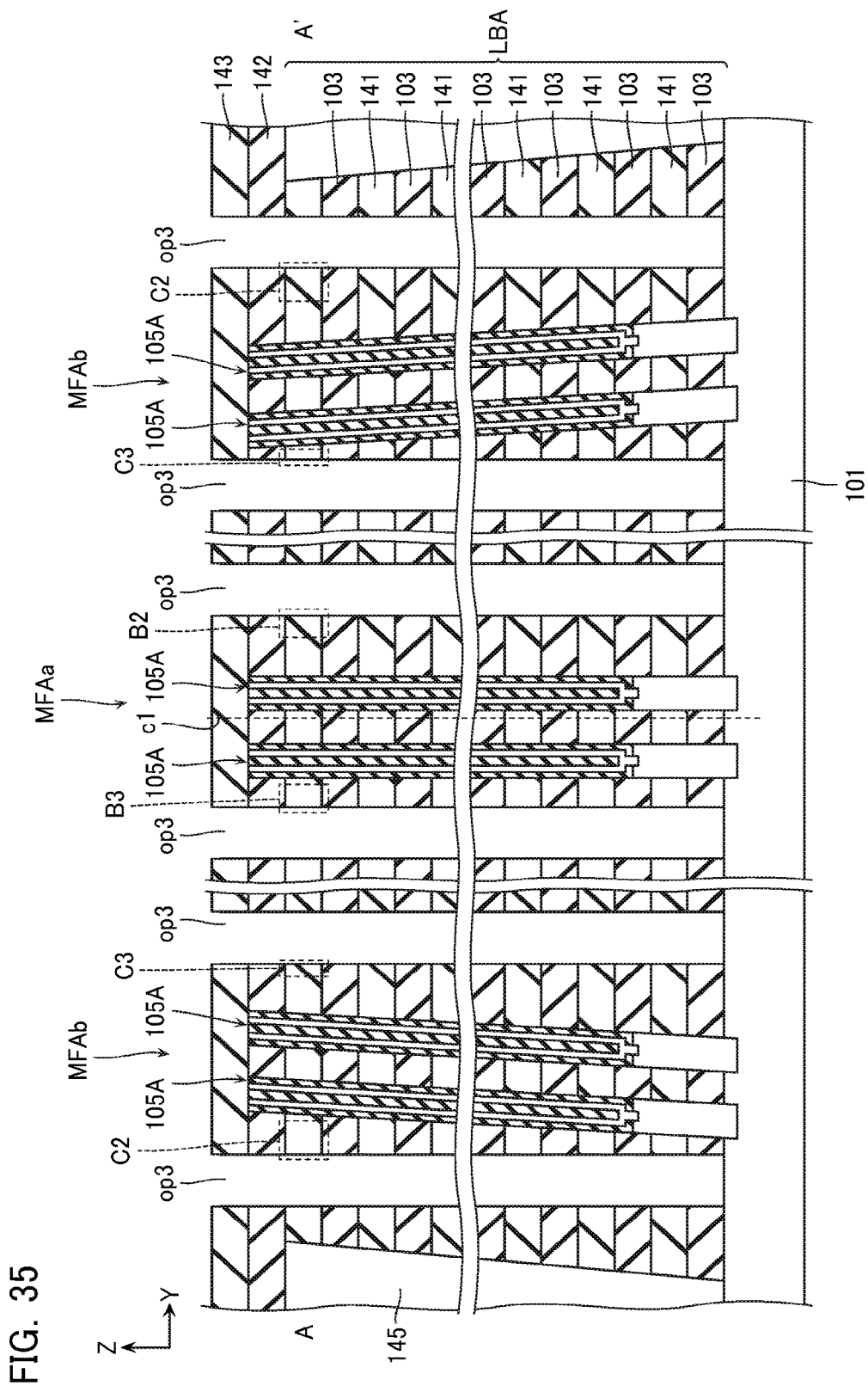
Figure 36:
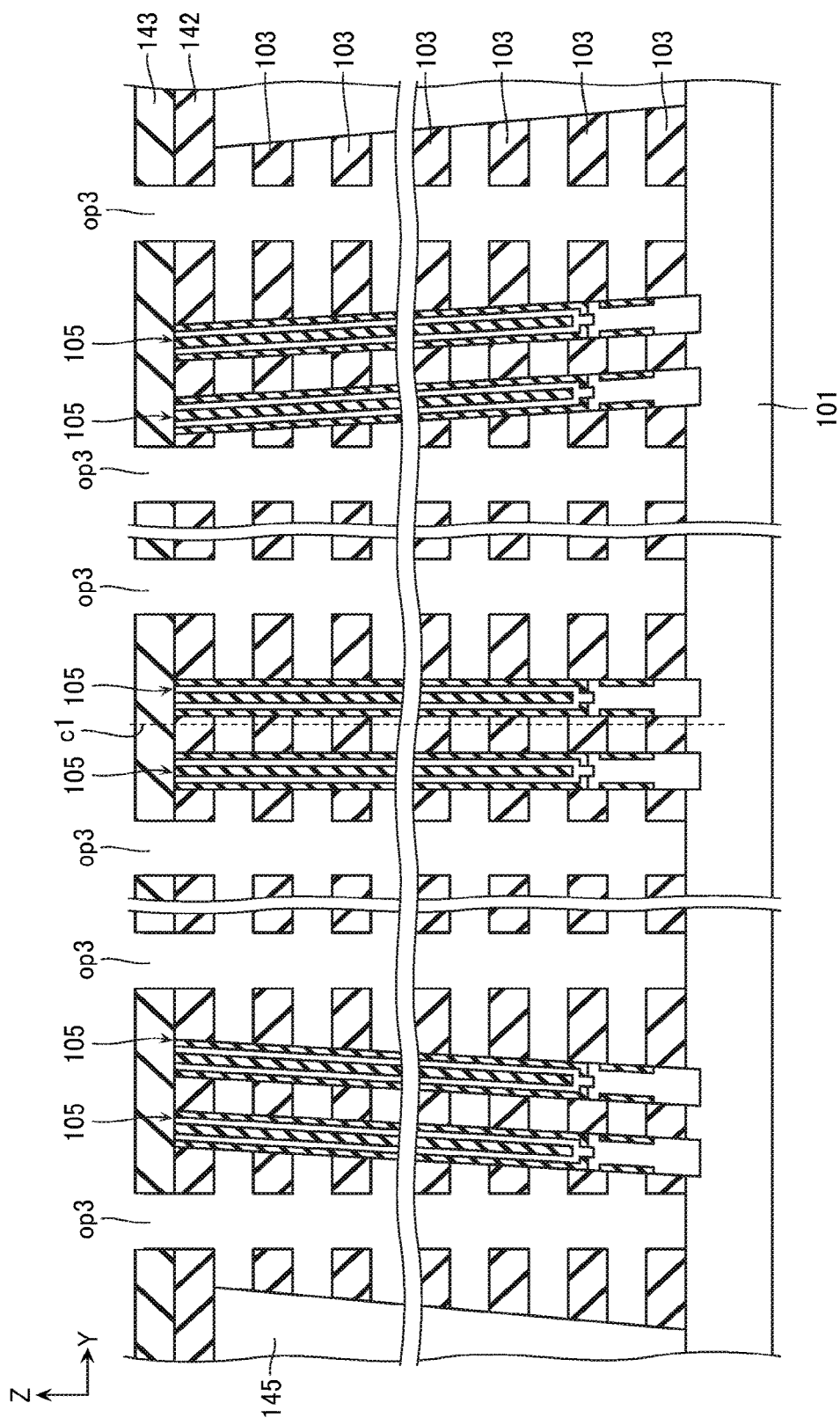
Figure 37:
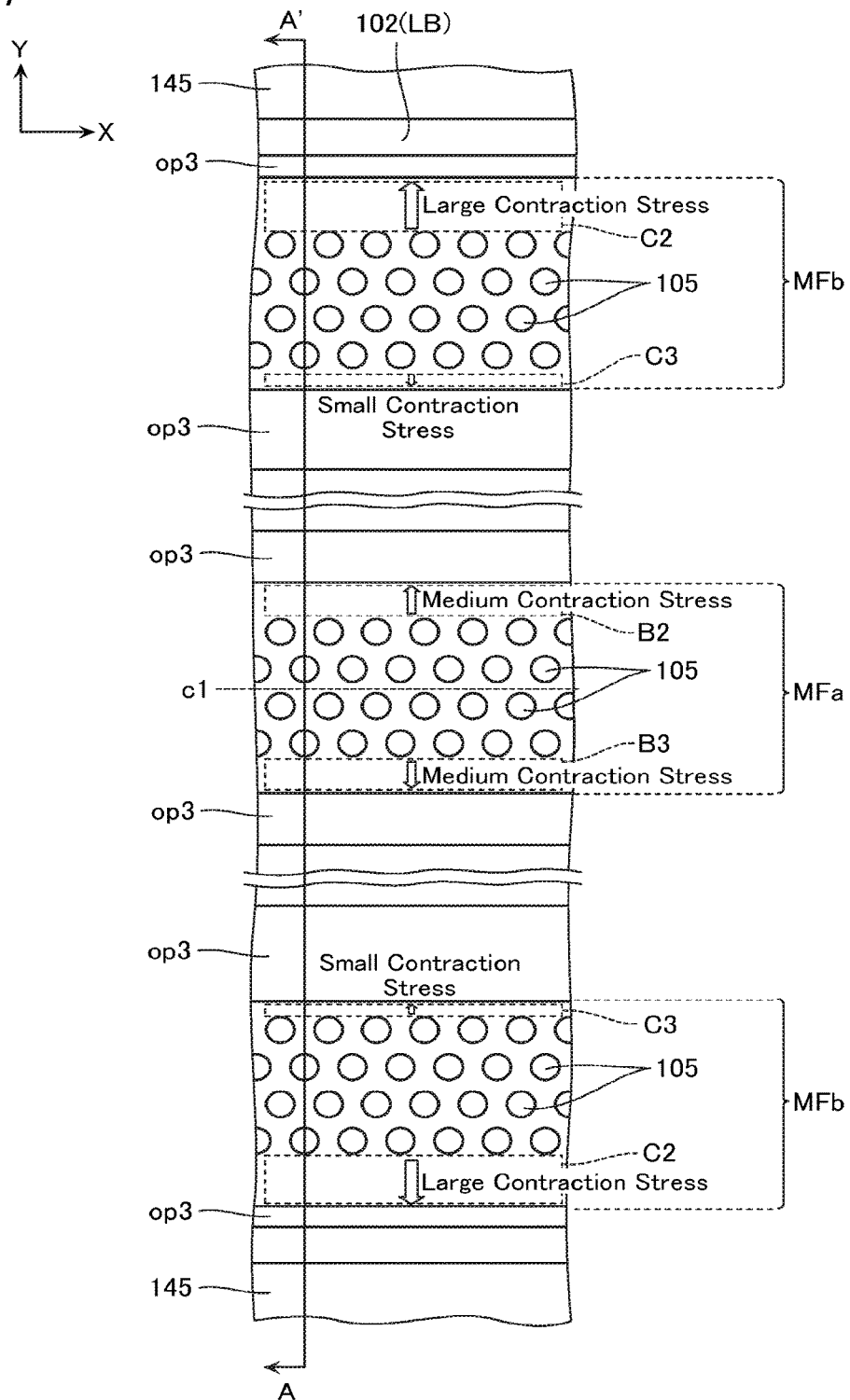

FIGS. 28 to 38 are cross-sectional views for explaining part of a method of manufacturing the semiconductor memory device according to the comparative example. Now, FIG. 28 is a view corresponding to the XY plan view shown in FIG. 10. Moreover, FIG. 29 is an enlarged view of portions indicated by A in FIG. 28. In addition, FIG. 30 is a YZ cross-sectional view of a structure shown in FIG. 29 cut along the line AA' looking in the direction of the arrows. Moreover, FIGS. 32, 34, and 37 are views corresponding to the XY plan view shown in FIG. 29; and FIGS. 31, 33, 35, 36, and 38 are views corresponding to the YZ cross-sectional view shown in FIG. 30. Note that c1 in the drawings is a line indicating a central position in the Y direction of the stacked body LB or the stacked body LBA. Moreover, FIGS. 28 to 38 are schematic views, and intervals between configurations, ratios of sizes, and so on, are not matched.

The method of manufacturing according to this comparative example is basically similar to the method of manufacturing according to the first embodiment, hence mainly a point different to in the first embodiment (a point that the second opening op2 is not formed in the stacked body LBA) will be described below using the drawings.

As shown in FIGS. 28 to 30, even in the method of manufacturing according to the comparative example, similarly to in the first embodiment, the stacked body LBA is formed, and a plurality of the first openings op1 are formed in the stacked body LBA. Note that for reasons of scale, and so on, the first opening op1 is not shown in FIG. 28. The first opening op1 extends straight in the Z direction.

Next, as shown in FIG. 31, the third semiconductor layer 126, the memory insulating film 120, and the amorphous semiconductor layer 122A are formed on the inside of the first opening op1.

Next, as shown in FIGS. 32 and 33, a crystalline state of the silicon in the amorphous semiconductor layer 122A is reformed by heat treatment, and the semiconductor layer 122B configured of polycrystalline-state silicon is formed. Now, when heat treatment is performed, the sacrifice layer 141 in the stacked body LBA contracts in the Y direction, and the stacked body LBA sometimes gets deformed. In such a case, the first opening op1 gets deformed in a portion far from the central position c1 in the Y direction (a portion close to an end in the Y direction) of the stacked body LBA.

Next, as shown in FIGS. 34 and 35, the core insulating film 121 is embedded on the inside of the first opening op1, and the columnar body 105A is formed. Now, the first opening op1 far from the central position c1 is deformed, hence a deformed columnar body 105A is formed on its inside.

Next, a plurality of the third openings op3 are formed in the stacked body LBA to form the finger structure MFA. Now, the third openings op3 are formed at certain intervals in the Y direction and extend straight in the Z direction, regardless of deformation of the columnar body 105A.

Now, in a finger structure MFAa close to the central position c1, deformation of the columnar body 105A to the Y direction is small. Therefore, as shown in FIG. 34, if regions provided in both lateral directions in the Y direction of the columnar body 105A are assumed to be B2 and B3, then widths in the Y direction of these regions B2 and B3 are substantially equal.

On the other hand, in a finger structure MFAb far from the central position c1, deformation of the columnar body 105A is large. Therefore, if, for example, regions provided in both lateral directions in the Y direction of the columnar body 105A are assumed to be C2 and C3, then a deviation ends up occurring in widths in the Y direction of these regions C2 and C3.

Next, as shown in FIG. 36, the sacrifice film 141 is removed and oxidation treatment is further performed to form the memory columnar body 105.

Figure 38:
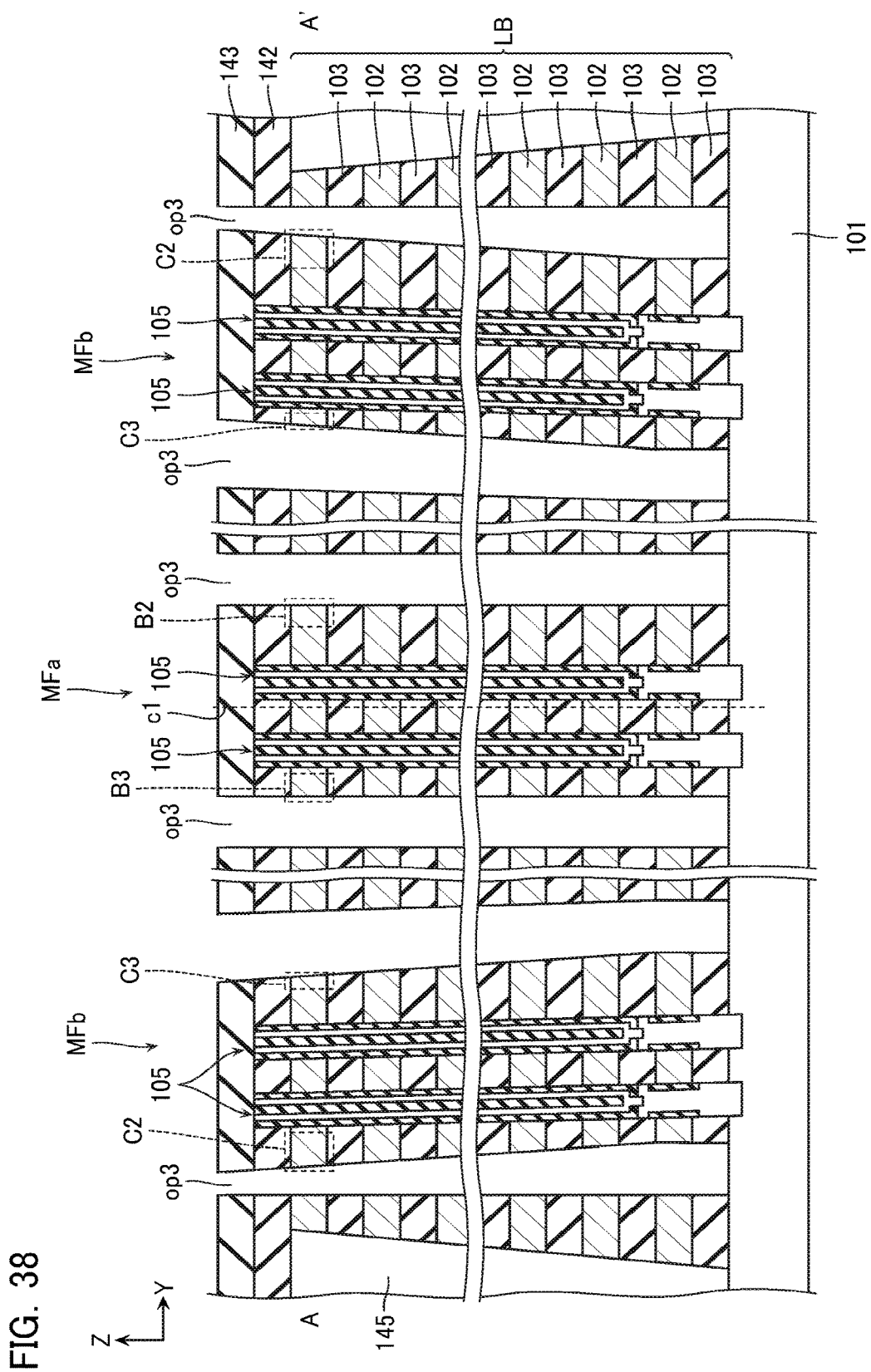

Next, as shown in FIGS. 37 and 38, tungsten (W), and so on, is formed on the upper surface, lower surface, and side surface of the inter-layer insulating film 103, and the portion formed on the side surface of the inter-layer insulating film 103, of the formed tungsten (W), and so on, is selectively removed by the likes of wet etching. As a result, the first conductive film 102 (stacked body LB) is formed, and the memory finger MF is formed.

Now, sometimes, when tungsten is formed under a high temperature, a contraction stress due to thermal contraction occurs when the tungsten is returned to a normal temperature.

Now, focusing on the memory finger MFa close to the central position c1, as shown in FIG. 37, the above-described contraction stress is generated mainly in the regions B2 and B3 in lateral directions in the Y direction of the memory columnar body 105. This is because the regions B2 and B3 are not provided with the memory columnar body 105, and the tungsten concentrates in the regions B2 and B3. Now, in the memory finger MFa, widths in the Y direction of the regions B2 and B3 are about the same, and amounts of tungsten provided in these regions B2 and B3 are also about the same. In such a case, the contraction stress to the Y direction occurring in the region B2 and the contraction stress to the Y direction occurring in the region B3 are about the same, and are canceled out.

On the other hand, in the memory finger MFb far from the central position c1, a deviation occurs in the widths in the Y direction of the regions C2 and C3, and an amount of tungsten provided in the region C2 becomes larger than an amount of tungsten provided in the region C3. In such a case, the contraction stress generated in the region C2 including much tungsten ends up being larger than the contraction stress generated in the region C3. As a result, as shown in FIG. 38, the memory finger MFb sometimes gets deformed in the Y direction. If the conductive film 108 (LI, FIG. 6) or the conductive film 114 (CH) are formed in such a state, then sometimes, the conductive film 114 does not contact the first semiconductor layer 122 and a contact defect occurs, or the conductive film 114 contacts the second conductive film 108 whereby a short circuit defect occurs.

[Advantages of First Embodiment]

Figure 39:
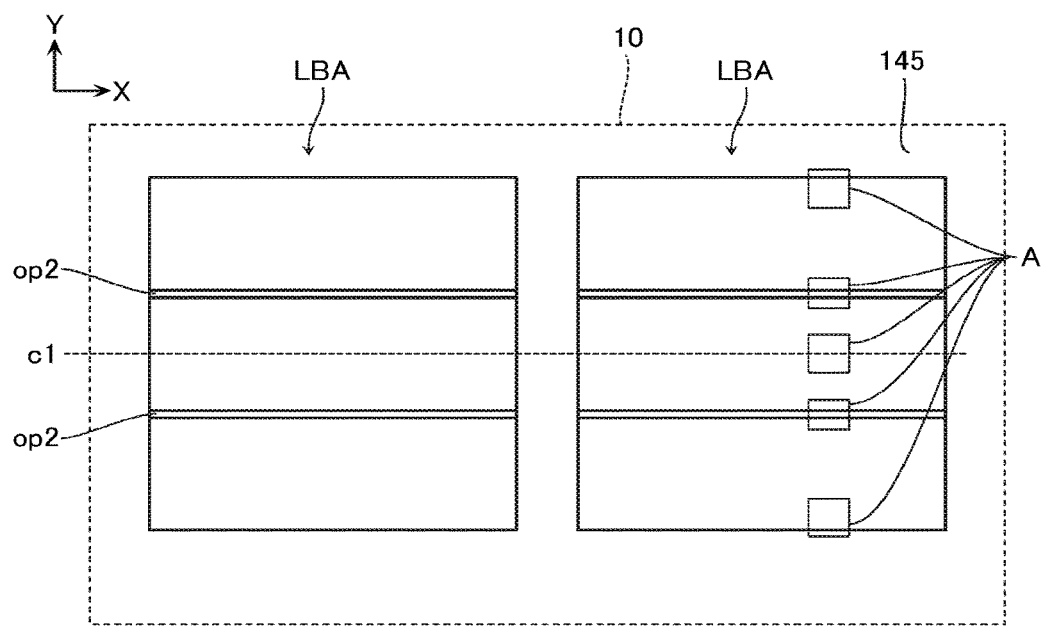
FIGS. 39 to 43 are views for explaining advantages of the first embodiment.
Figure 40:
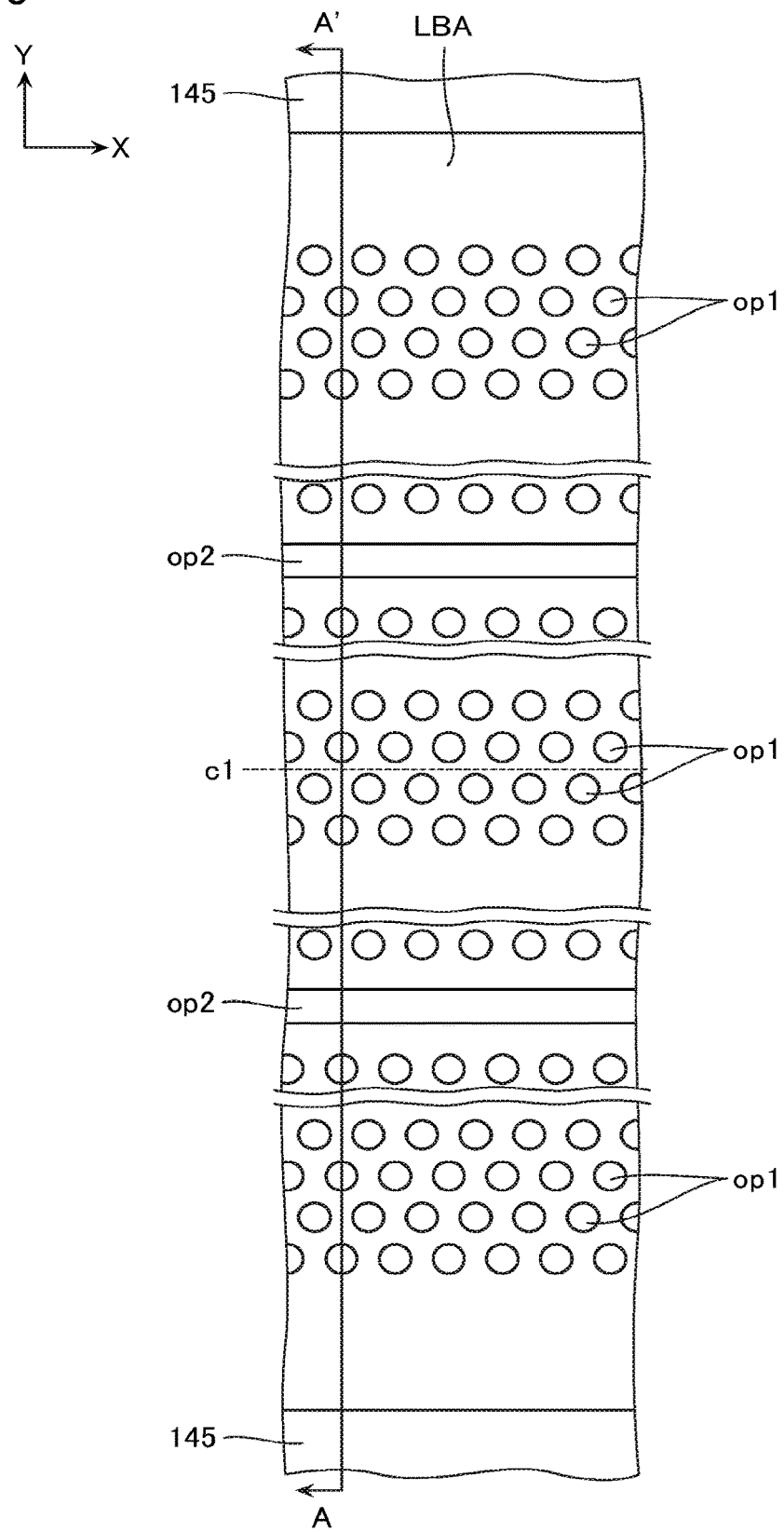
Figure 41:
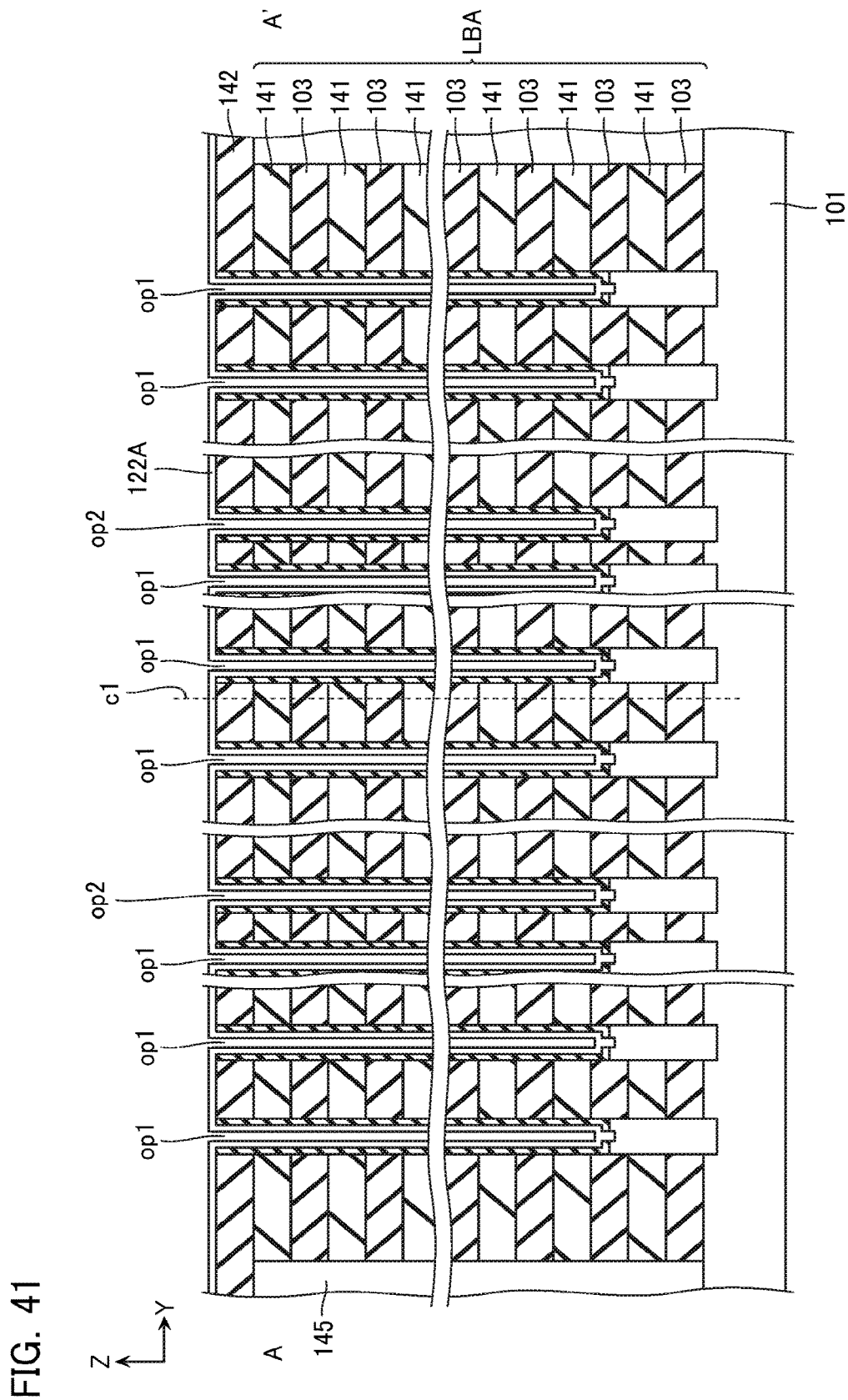
Figure 42:
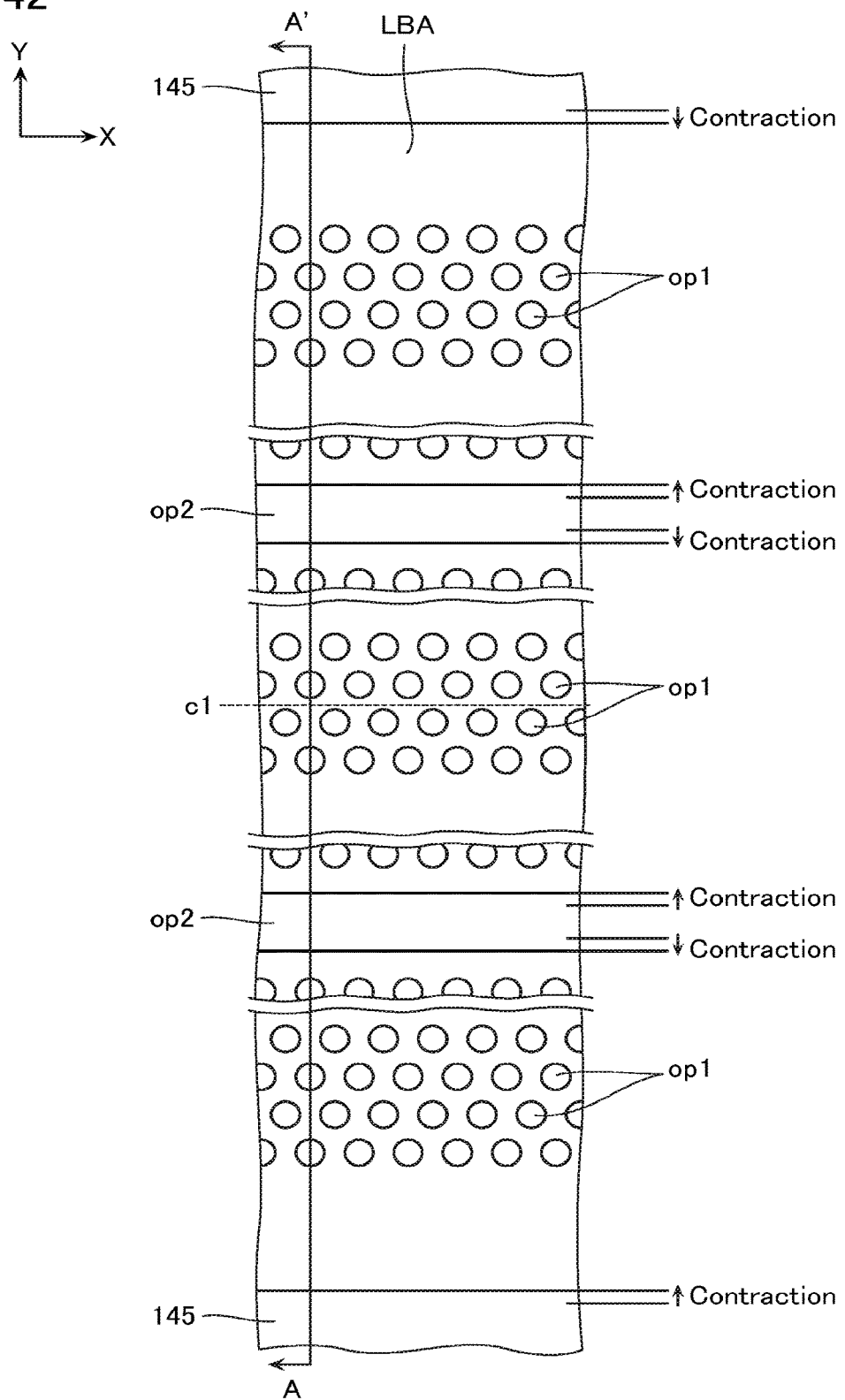
Figure 43:
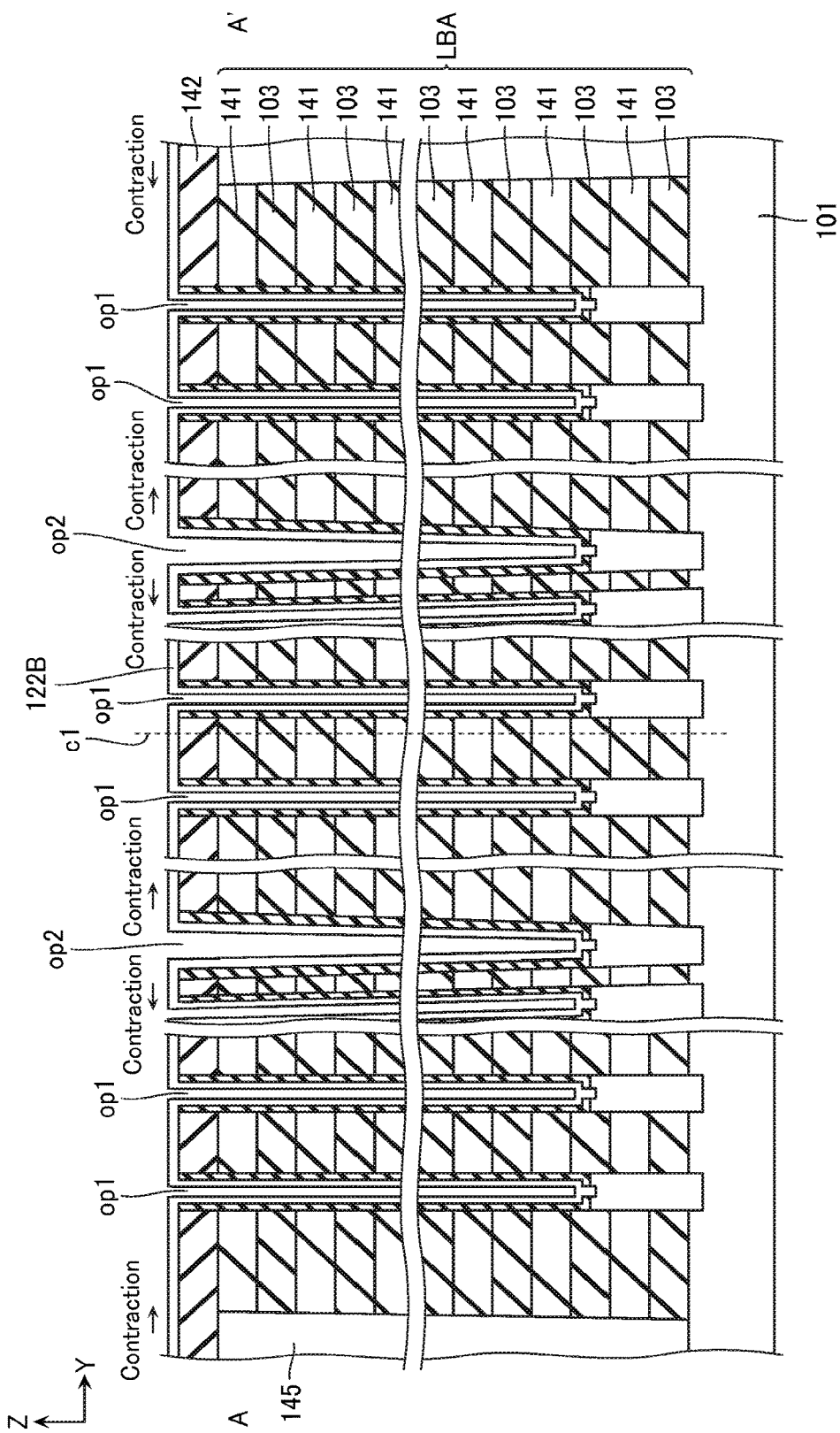

FIGS. 39 to 43 are views for explaining advantages of the first embodiment. FIG. 39 is an XY plan view showing a portion corresponding to FIG. 10. FIG. 40 is an enlarged view of portions indicated by A in FIG. 39. Moreover, FIG. 41 is a YZ cross-sectional view of a structure shown in FIG. 40 cut along the line AA' looking in the direction of the arrows. Moreover, FIG. 42 is an XY plan view showing a portion corresponding to FIG. 40; and FIG. 43 is a YZ cross-sectional view showing a portion corresponding to FIG. 41. Note that FIGS. 39 to 43 are schematic views, and intervals between configurations, ratios of sizes, and so on, are not matched.

As shown in FIGS. 39 to 41, in the present embodiment, when the first opening op1 is provided in the stacked body LBA, the second opening op2 is provided and the stacked body LBA is divided in the Y direction. Moreover, as shown in FIGS. 42 and 43, heat treatment is performed in a state where the second opening op2 has been formed in the stacked body LBA.

Now, when heat treatment for forming the polycrystalline semiconductor layer 122B is performed, the sacrifice film 141 in the stacked body LBA sometimes contracts in the Y direction. However, in the present embodiment, the sacrifice film 141 is divided in the Y direction by the second opening op2 which is a trench extending in the Z direction and the X direction, for example. Therefore, a length in the Y direction of the sacrifice film 141 is made smaller than in the comparative example, whereby a contraction amount to the Y direction of the sacrifice film 141 can be reduced, and deformation of the stacked body LBA can be reduced. This makes it possible for deformation of the columnar body 105A to be suppressed and for deformation of the memory finger MF to be suppressed, whereby occurrence of the above-mentioned kind of contact defect or short circuit defect can be suppressed.

Moreover, in the method of manufacturing according to the present embodiment, the first structure 201 is formed on the inside of the second opening op2, and furthermore, the stacked body LB is formed using the stacked body LBA divided by the second opening op2. Therefore, the semiconductor memory device according to the present embodiment ends up comprising: the stacked body LB; and the first structure 201 dividing this stacked body LB in the Y direction. Such a semiconductor memory device can have deformation of the memory finger MF suppressed in a manufacturing step, and can be easily manufactured.

Moreover, in the method of manufacturing according to the present embodiment, patterning and RIE for the second opening op2 are performed in a batch along with those of the first opening op1 (FIGS. 12 to 14). Therefore, the method of manufacturing according to the present embodiment is achievable without further increasing the number of manufacturing steps compared to the method of manufacturing according to the comparative example.

In such a method of manufacturing, the memory insulating film 120, the amorphous semiconductor layer 122A, and so on, are formed not only in the first opening op1, but also on an inner wall of the second opening op2 (FIGS. 15 to 22). Therefore, in the semiconductor memory device according to the present embodiment, not only the memory columnar body 105 formed on the inside of the first opening op1, but also the first structure 201 formed on the inside of the second opening op2 ends up including the likes of the memory insulating film 120 and the first semiconductor film 122. Such a semiconductor memory device can be manufactured without further increasing the number of manufacturing steps compared to the semiconductor memory device according to the comparative example.

Now, the first opening op1 is a substantially circular shaped through hole, and the second opening op2 is a trench extending in the X direction (FIG. 13). Therefore, if patterning of these first opening op1 and second opening op2 is performed in a batch, periodicity of a pattern of the first opening op1 ends up breaking down. As a result, it sometimes happens that an inner diameter of the first opening op1 provided close to the second opening op2 increases or decreases or that a shape of that first opening op1 breaks down. If the memory columnar body 105 is formed on the inside of such a first opening op1, then characteristics as a memory sometimes deteriorate.

Accordingly, in the semiconductor memory device according to the present embodiment, the memory finger MF2 provided close to the second opening op2 (the second memory finger MF2 and the third memory finger MF3 of FIG. 6) is configured as a dummy finger, and occurrence of a malfunction, and so on, is suppressed.

Note that, for example, by performing lithography of the first opening op1 and the second opening op2 separately, it is also possible for the likes of shape breakdown of the first opening op1 close to the second opening op2 to be suppressed. Even in such a case, the number of manufacturing steps substantially does not increase compared to in the comparative example.

Moreover, in the same method of manufacturing, the stacked body LBA is divided into equal intervals at the first intervals $W_{SP}$ by the second opening op2 (FIG. 12). As a result, an effect of thermal contraction of the sacrifice film 141 is uniformly dispersed, whereby it can be prevented that any of the memory fingers MF largely deforms, and occurrence of the above-mentioned kind of contact defect or short circuit defect can be suppressed.

In the semiconductor memory device manufactured by such a method of manufacturing, the first structures 201 end up being arranged at the first intervals $W_{SP}$ in the Y direction, and the memory plane MP ends up being divided into a plurality of the sub-planes SP by these plurality of first structures 201 (FIG. 5). Such a semiconductor memory device allows the effect of thermal contraction of the sacrifice film 141 to be uniformly dispersed in a manufacturing step, and can be easily manufactured.

Moreover, in the method of manufacturing according to the present embodiment, for example, the width $W_{op1}$ in the Y direction of the first opening op1 and the width $W_{op2}$ in the Y direction of the second opening op2 (FIG. 13) are about the same, or the width $W_{op2}$ is narrower than the width $W_{op1}$. Now, the width $W_{op2}$ in the Y direction of the second opening op2 broadens in the heat treatment step, and an occupied area in the memory plane MP increases. Therefore, in order for many memory cells MC to be provided in the memory plane MP, the width $W_{op2}$ is desirably small. On the other hand, in order for the effect of thermal contraction of the sacrifice film 141 to be preferably dispersed, the second opening op2 is desirably not embedded by the amorphous semiconductor layer 122A, as exemplified in FIG. 18. Now, when, for example, the width $W_{op2}$ in the Y direction of the second opening op2 has been set to about the same as the width $W_{op1}$ in the Y direction of the first opening op1, the occupied area in the memory plane MP is small, and moreover, the second opening op2 is not embedded by the amorphous semiconductor layer 122A. Furthermore, patterning can be performed under similar conditions to those for the first opening op1, hence is easily achievable. Moreover, by, for example, making the width $W_{op2}$ in the Y direction of the second opening op2 small enough for the second opening op2 not to be embedded by the amorphous semiconductor layer 122A, the occupied area in the memory plane MP can be further suppressed.

[Other Embodiments]

Figure 44:
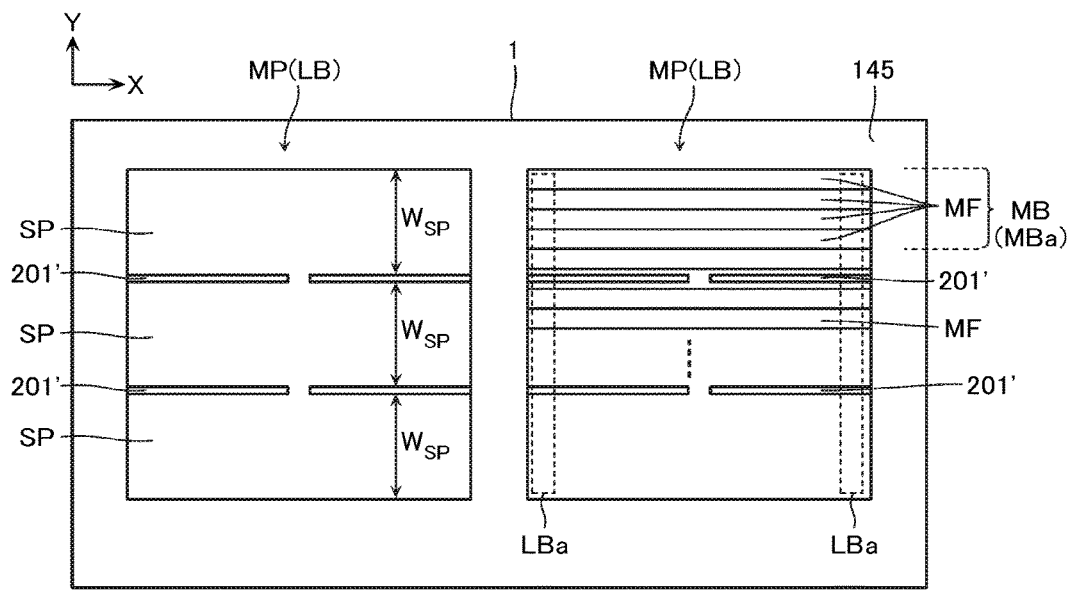
FIGS. 44 and 45 are plan views showing configurations of semiconductor memory devices according to modified examples.
Figure 45:
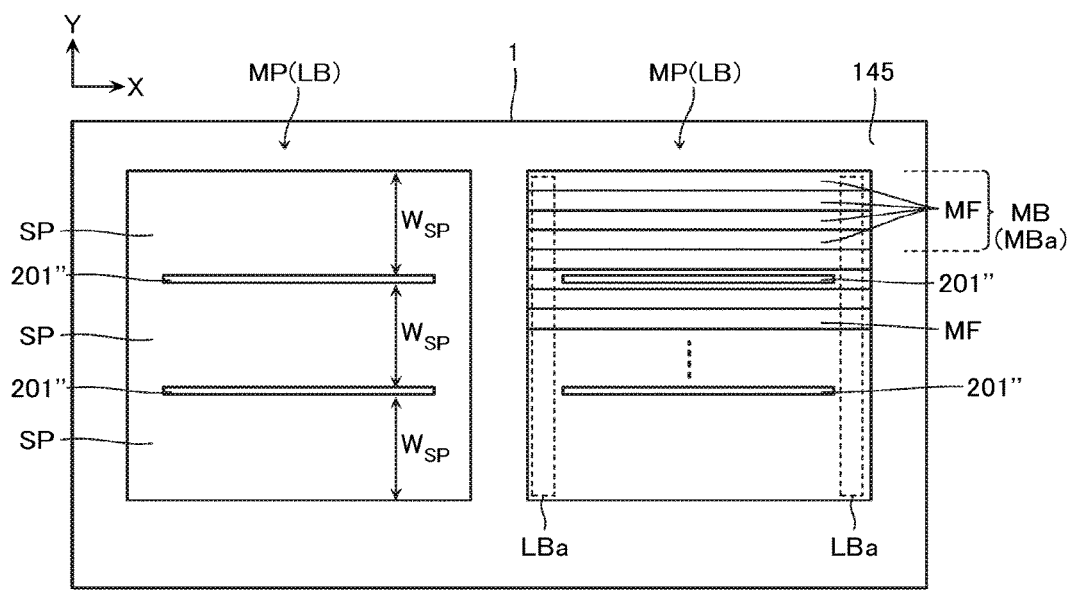

In the first embodiment, the stacked body LBA is divided in the Y direction by the second opening op2 (FIGS. 12 to 14). However, the second opening op2 may be discontinued at an arbitrary place in the memory plane MP. In this case, as shown in FIG. 44, a first structure 201' discontinued at the arbitrary place in the memory plane MP ends up being formed. Moreover, the second opening op2 need not be provided in the stepped part LBa provided at the end in the X direction of the stacked body LBA. In this case, as shown in FIG. 45, a first structure 201" extending in the X direction avoiding the stepped part LBa, ends up being formed.

Moreover, in the first embodiment, the second opening op2 has a linear planar shape extending in the X direction. However, the planar shape of the second opening op2 is appropriately changeable, and may, for example, have a continuous circle shape that can be made by arranging a plurality of circles in the X direction with a shorter pitch than a diameter of these circles. In this case, the planar shape of the first structure 201 is also a continuous circle.

Figure 46:
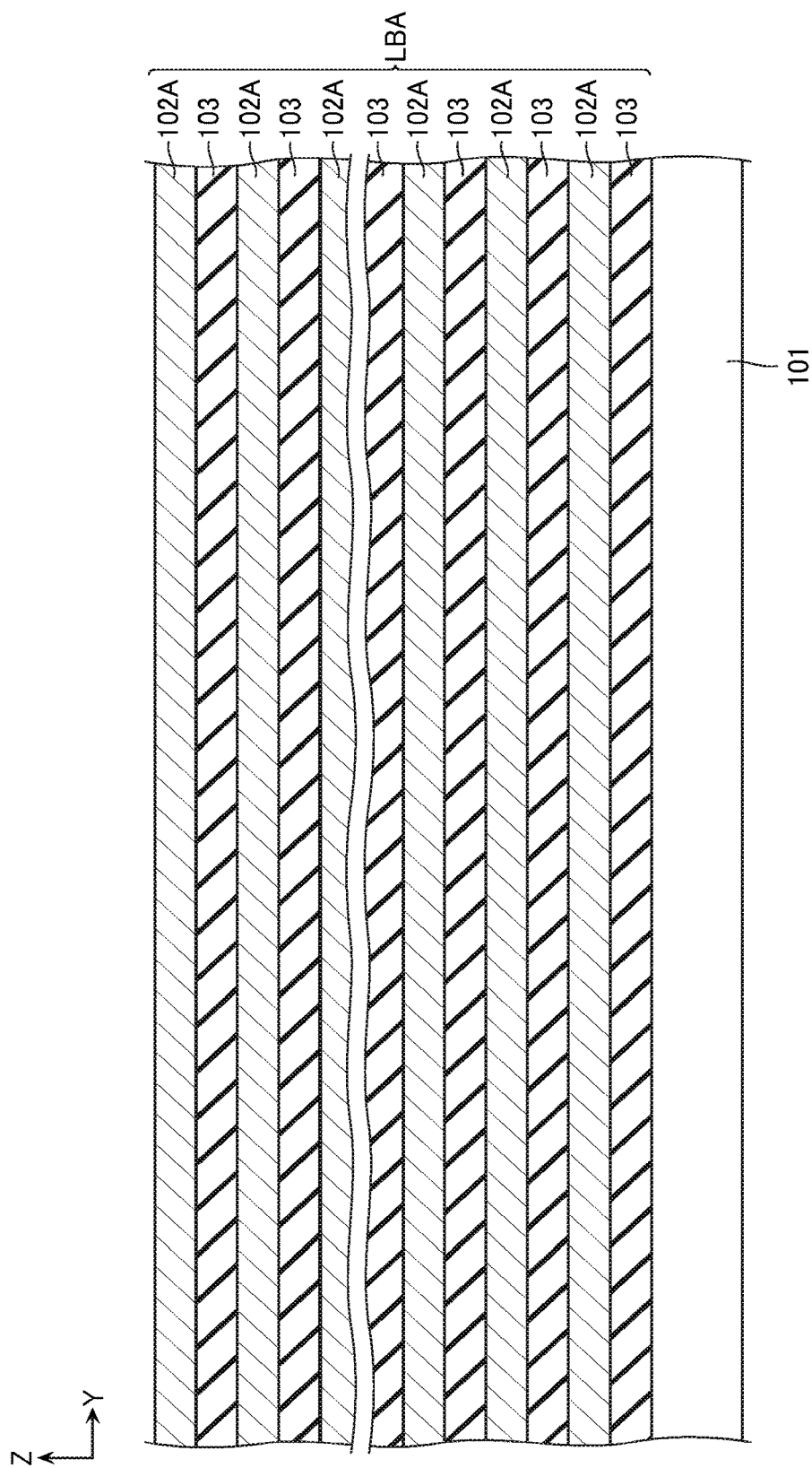
FIG. 46 is a cross-sectional view for explaining a method of manufacturing a semiconductor memory device according to an embodiment.

Moreover, in the first embodiment, the sacrifice film 141 is provided as the first film in the stacked body LBA. However, as shown in FIG. 46, for example, a conductive film 102A or a semiconductor film of the likes of amorphous silicon or polycrystalline silicon may be provided as the first film in the stacked body LBA. In this case, as shown in FIG. 26, the first conductive films 102 can be formed by forming the third opening op3 to divide the first films (the conductive films 102A).

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a substrate;
   a plurality of first conductive films stacked in a first direction above the substrate and extend in a second direction intersecting the first direction and in a third direction intersecting the first direction and the second direction;
   a memory columnar body extending in the first direction and having a side surface covered by the plurality of first conductive films; and
   a first structure extending in the second direction and dividing the plurality of first conductive films in the third direction, a length of the first structure in the second direction being greater than a length of the first structure in the third direction, and the length of the first structure in the second direction being equal to or greater than a length of the plurality of first conductive films in the second direction,
   each of the memory columnar body and the first structure comprising:
      a memory insulating film provided on a side surface of at least one of the plurality of first conductive films; and
      a first semiconductor layer provided on a side surface of the memory insulating film.

2. The semiconductor memory device according to claim 1, wherein the memory insulating film comprises a first insulating film, a charge accumulation film, and a second insulating film provided sequentially on the side surface of a first conductive film of the plurality of first conductive films.

3. The semiconductor memory device according to claim 1, comprising:
   a memory plane provided above the substrate and including the plurality of first conductive films and the memory columnar body; and
   a plurality of the first structures arranged at first intervals in the third direction,
   wherein the memory plane is divided into a plurality of sub-planes by the plurality of first structures.

4. The semiconductor memory device according to claim 3, further comprising
   a plurality of second structures arranged in the third direction at second intervals smaller than the first intervals, extending in the second direction, and dividing the plurality of first conductive films in the third direction,
   wherein the memory plane is divided into a plurality of memory fingers by the plurality of second structures, and
   a sub-plane of the plurality of sub-planes includes a plurality of the memory fingers.

5. The semiconductor memory device according to claim 4, further comprising:
   a second semiconductor layer connected to a lower end of the memory columnar body and extending in the third direction;
   a source line contact connected at a lower end thereof to the second semiconductor layer and extending in the first direction; and
   a source line provided above the source line contact and connected to the source line contact,
   wherein the second structure includes the source line contact.

6. The semiconductor memory device according to claim 4, wherein
   the memory plane comprises:
      a first memory finger provided within the sub-plane; and
      a second memory finger provided at a boundary of two of the sub-planes adjacent in the third direction,
   the first memory finger is a memory finger recording user data, and
   the second memory finger is a dummy finger not recording user data.

7. The semiconductor memory device according to claim 6, wherein
   the memory plane further comprises a third memory finger provided between the first memory finger and the second memory finger, and
   the third memory finger is a dummy finger not recording user data.

8. The semiconductor memory device according to claim 1, wherein
   each of the memory columnar body and the first structure further comprises a third insulating film having a side surface covered by the first semiconductor layer.

9. The semiconductor memory device according to claim 1, wherein
   the first semiconductor layer extends in the first direction, and
   each of the memory columnar body and the first structure further comprises a third semiconductor layer provided at a lower end of the first semiconductor layer.

10. The semiconductor memory device according to claim 1, wherein
    the length of the first structure in the third direction is greater than a length of the memory columnar body in the third direction.

11. The semiconductor memory device according to claim 1, wherein
    the first structure has a substantially rectangular shape when viewed from the first direction.

12. The semiconductor memory device according to claim 1, wherein
    the first structure includes at least one slit that extends along the length of the plurality of first conductive films in the second direction and creates a space between the divided plurality of first conductive films in the third direction so as to suppress thermal contraction of the semiconductor memory device in the third direction.

* * * * *